United States Patent
Mason et al.

(10) Patent No.: US 9,763,329 B1
(45) Date of Patent: Sep. 12, 2017

(54) TECHNIQUES FOR OBSERVING AN ENTIRE COMMUNICATION BUS IN OPERATION

(71) Applicant: Apple Inc., Cupertino, CA (US)

(72) Inventors: Anne M. Mason, Palo Alto, CA (US); Peter J. Johnston, San Francisco, CA (US); Christine A. Laliberte, Portland, OR (US); Dominic P. McCarthy, Los Altos Hills, CA (US); Shawn X. Arnold, Santa Cruz, CA (US); Souvik Mukherjee, Campbell, CA (US)

(73) Assignee: Apple Inc., Cupertino, CA (US)

( * ) Notice: Subject to any disclaimer, the term of this patent is extended or adjusted under 35 U.S.C. 154(b) by 42 days.

(21) Appl. No.: 15/068,474

(22) Filed: Mar. 11, 2016

(51) Int. Cl.
*H05K 7/10* (2006.01)
*H05K 1/18* (2006.01)
*H05K 1/11* (2006.01)
*H05K 1/02* (2006.01)
*H05K 3/40* (2006.01)
*H05K 3/30* (2006.01)

(52) U.S. Cl.
CPC ........... *H05K 1/181* (2013.01); *H05K 1/0296* (2013.01); *H05K 1/114* (2013.01); *H05K 1/115* (2013.01); *H05K 1/183* (2013.01); *H05K 3/301* (2013.01); *H05K 3/4038* (2013.01); *H05K 2201/10022* (2013.01)

(58) Field of Classification Search
USPC ......................................... 361/767, 752, 808
See application file for complete search history.

(56) References Cited

U.S. PATENT DOCUMENTS

| 7,277,005 | B2 | 10/2007 | Kang et al. |
| 7,911,318 | B2 | 3/2011 | Shyu et al. |
| 8,166,653 | B2 | 5/2012 | Park et al. |
| 8,381,394 | B2 | 2/2013 | Shizuno |

(Continued)

FOREIGN PATENT DOCUMENTS

CN 102573292 A 7/2012

OTHER PUBLICATIONS

Grison, "Agilent Compliance and Validation Solution for DDR 1, 2 and 3 with Infiniium Series Oscilloscope," Agilent Technologies, http://scopetools.free.fr/Applications/DDR2_LPDDR2_DDR3/DDR_DDR2_DDR3_Caracterisation_Debug_Compliance_Agilent.pdf, retrieved Mar. 15, 2016, 69 pages.

(Continued)

*Primary Examiner* — Andargie M Aychillhum
(74) *Attorney, Agent, or Firm* — Kilpatrick Townsend & Stockton LLP

(57) ABSTRACT

A circuit board includes conductive traces being sandwiched by an upper insulating layer and a lower insulating layer, a first array of conductive vias extending perpendicularly to the conductive traces, the vias in the first array of conductive vias being arranged such that any two adjacent vias in a row of vias extending along any given dimension in the first array of conductive vias are equally spaced from each other, and isolation resistors embedded within the first array of conductive vias such that each isolation resistor is disposed between at least two adjacent vias in the first array of conductive vias, each isolation resistor being disposed closer to the conductive via to which the isolation resistor is coupled than all other conductive vias surrounding the isolation resistor.

20 Claims, 11 Drawing Sheets

(56) References Cited

U.S. PATENT DOCUMENTS

| | | | |
|---|---|---|---|
| 9,035,194 B2* | 5/2015 | Hossain | H05K 3/42 174/255 |
| 2005/0175385 A1 | 8/2005 | Cho et al. | |
| 2013/0244490 A1* | 9/2013 | Rathburn | H05K 3/326 439/628 |
| 2014/0239994 A1 | 8/2014 | Moreira et al. | |

OTHER PUBLICATIONS

Schnaible, "Agilent BGA Interposers for Memory Applications," Agilent Technologies, Nov. 2013, 11 pages.

* cited by examiner

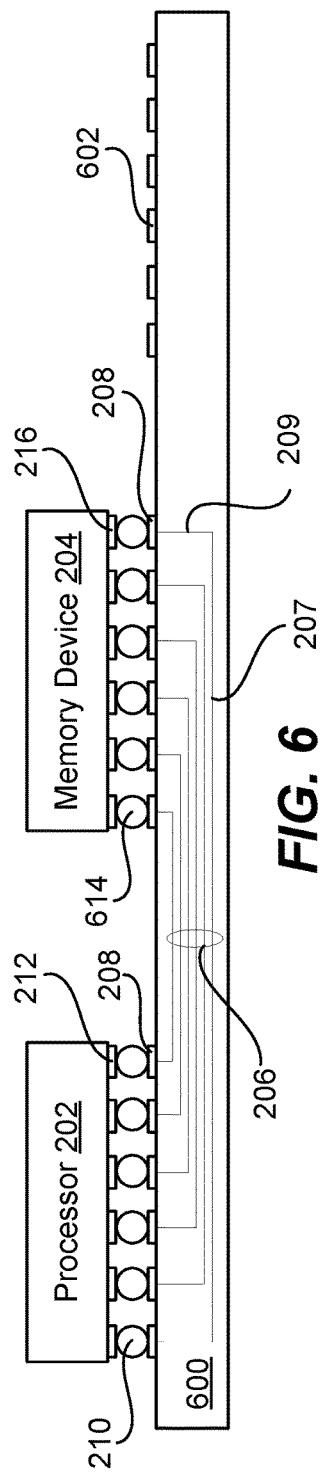
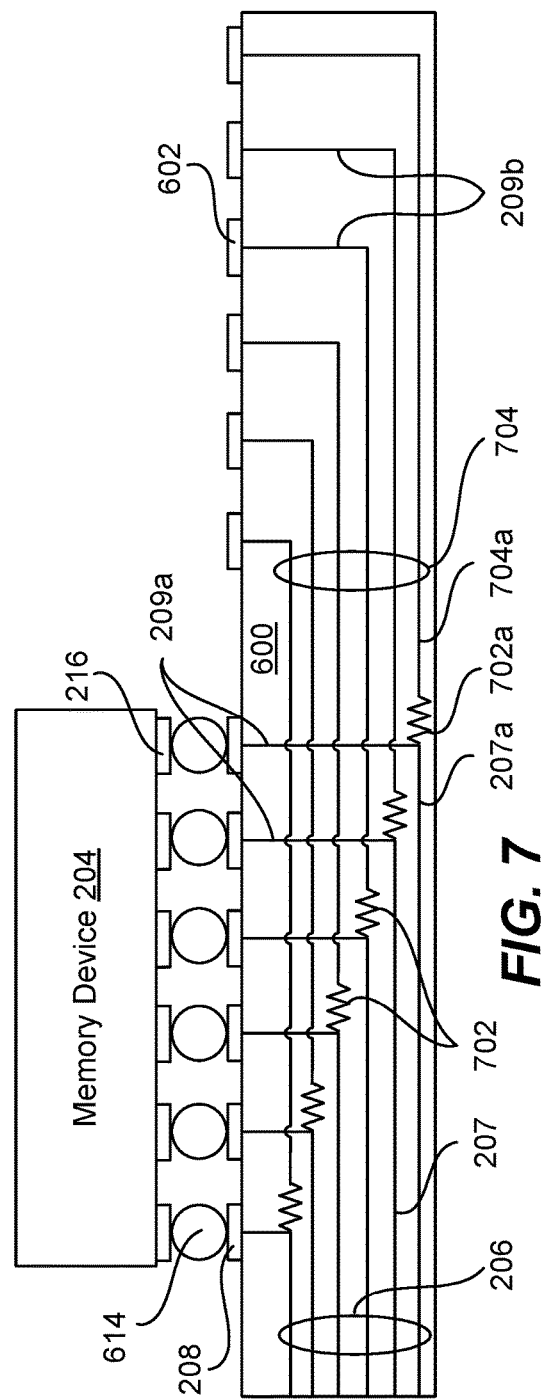

TECHNIQUES FOR OBSERVING AN ENTIRE COMMUNICATION BUS IN OPERATION

FIELD

The described embodiments relate generally to techniques for monitoring electronic components. More particularly, the present embodiments relate to techniques for monitoring an entire communication bus through which two or more electronic components communicate with one another.

BACKGROUND

Modern electronic devices such as mobile phones, tablets, notebooks, laptops, and the like have become ubiquitous in modern day life. An individual may heavily rely on such electronic devices throughout the day to stay connected with family and friends or to perform routine day-to-day tasks. As people become more dependent on these devices, demand for higher performing electronic devices naturally ensues.

To address this demand, improvements to electronic components, e.g., memory and microprocessor components, within the electronic devices have been achieved. One common way of improving such electronic components is by decreasing their power consumption while also increasing the speed at which they operate, thereby maximizing battery life and operational performance. Additionally, the size of the electronic components have been decreasing thus reducing their footprint and allowing more compact electronic devices to be produced.

However, low voltage operation, high operation speed, and smaller component size have increased the difficulty in monitoring these components during operation. For example, electrical pathways have become miniaturized and deeply embedded within the device, making it difficult to access the device for purposes of monitoring its operation. Accordingly, techniques for accurately monitoring these electronic components are desired.

SUMMARY

Embodiments provide methods, apparatuses, and systems for monitoring an entire communication bus in operation.

In some embodiments, a circuit board for monitoring an entire communication bus in operation includes conductive traces being sandwiched by an upper insulating layer and a lower insulating layer. The circuit board may include a first array of conductive vias extending perpendicularly to the conductive traces, the vias in the first array of conductive vias being arranged such that any two adjacent vias in a row of vias extending along any given dimension in the first array of conductive vias are equally spaced from each other. The circuit board may further include isolation resistors embedded within the first array of conductive vias such that each isolation resistor is disposed between at least two adjacent vias in the first array of conductive vias, where the conductive traces include a first group of conductive traces, each of the conductive traces in the first group of conductive traces being coupled to a different conductive via in the first array of conductive vias through one of the isolation resistors, each isolation resistor being disposed closer to the conductive via to which the isolation resistor is coupled than all other conductive vias surrounding the isolation resistor, each isolation resistor being configured to produce a copy of a signal flowing through the conductive via that is coupled to one end of the isolation resistor on the conductive trace that is coupled to an opposite end of the isolation resistor.

In certain embodiments, each conductive trace in the first group of conductive traces may include a conductive upper layer and a resistive lower layer, the conductive upper layer having an opening through which a portion of the resistive lower layer is exposed, the exposed portion of the resistive lower layer forming one of the isolation resistors. The exposed portion of the resistive layer may be spaced less than 50 μm from the conductive via to which it is coupled. In embodiments, a spacing between every two adjacent conductive vias along a row of conductive vias in the first array of conductive vias may be in the range of 0.35 mm to 0.8 mm. A resistance value of each embedded isolation resistor may be less than 50 ohms. In some embodiments, the circuit board may further include a first array of contact pads disposed on a surface of the circuit board, each via in the first array of conductive vias terminating at and electrically connecting to a corresponding contact pad in the first array of contact pads, where the circuit board is configured so that a first integrated circuit can be mounted on and electrically connected to the first array of contact pads.

In embodiments, the circuit board may further include a second array of conductive vias being insulated from one another, and a second array of contact pads disposed on a surface of the circuit board, each via in the second array of conductive vias terminating at and electrically connecting to a corresponding contact pad in the second array of contact pads, the second array of contact pads being connected to the first group of conducive traces through the second array of conductive vias. The circuit board may be configured so that a monitoring device can be connected to the second array of contact pads for monitoring signals on the second array of contact pads. The monitoring device may be one of a diagnostic tool and an FPGA. In some embodiments, the first array of conductive vias may form part of a communication bus through which the first integrated circuit can communicate with a second integrated circuit, and during operation, each conductive trace in the first group of conductive traces carries a copy of a bus signal propagating through a corresponding one of the conductive vias in the first array of conductive vias so that the entire communication bus can be simultaneously monitored on the second array of contact pads.

In embodiments, the circuit board may further include a third array of contact pads on a surface of the circuit board, a third array of conductive vias being insulated from one another, and a third array of contact pads disposed on a surface of the circuit board, each via in the third array of conductive vias terminating at and electrically connecting to a corresponding contact pad in the third array of contact pads, the conductive traces including a second group of conducive traces, the third array of contact pads being connected to the second group of conducive traces through the third array of conductive vias, where the circuit board is configured so that a second integrated circuit can be mounted on and electrically connected to the third array of contact pads. The first array of conductive vias may include through-vias connecting the first array of contact pads disposed on a first surface of the circuit board to corresponding contact pads in an array of contact pads disposed on a second surface of the circuit board opposite the first surface.

The circuit board may also include a plurality of interconnect layers stacked on top of one another, each interconnect layer being insulated from an adjacent interconnect layer, where the conductive traces include multiple groups of conductive traces, each group of conductive traces being disposed in a different one of the plurality of interconnect layers, and the conductive traces in each group of conductive traces extending along the same plane, where the isolation resistors are disposed in a first one of the plurality of interconnect layers, and each of the conductive traces in the group of conductive traces disposed in the first one of the plurality of interconnect layers includes a conductive upper layer and a resistive lower layer. In certain embodiments, the circuit board may further include a plurality of interconnect layers stacked on top of one another, each interconnect layer being insulated from an adjacent interconnect layer, where the conductive traces include multiple groups of conductive traces, each group of conductive traces being disposed in a different one of the plurality of interconnect layers, the conductive traces in each group of conductive traces extending along the same plane, where the isolation resistors are disposed in two or more of the plurality of interconnect layers.

In embodiments, a method of forming a circuit board for monitoring an entire communication bus in operation includes forming conductive traces insulated from one another, forming multiple arrays of conductive vias extending perpendicularly to the conductive traces, and forming multiple arrays of contact pads disposed on one or more surfaces of the circuit board, the multiple arrays of contact pads including a first array of contact pads, the multiple arrays of conductive vias including a first array of conductive vias, each via in the first array of conductive vias terminating at and electrically connecting to a corresponding contact pad in the first array of contact pads, the vias in the first array of conductive vias being arranged such that any two adjacent vias in a row of vias extending along any given dimension in the first array of conductive vias are equally spaced from each other, where the conductive traces include a first group of conductive traces, each conductive trace in the first group of conductive traces being coupled to a different conductive via in the first array of conductive vias through an isolation resistor embedded in the first array of conductive vias adjacent the conductive via to which the isolation resistor is coupled, each isolation resistor being disposed between at least two adjacent vias in the first array of conductive vias, and each isolation resistor being disposed closer to the conductive via to which the isolation resistor is coupled than all other conductive vias surrounding the isolation resistor, each isolation resistor being configured to produce a copy of a signal flowing through the conductive via that is coupled to one end of the isolation resistor on the conductive trace that is coupled to an opposite end of the isolation resistor.

In embodiments, forming each conductive trace in the first group of conductive traces providing a conductive layer, forming a resistive layer on the conductive layer, and forming an opening in the conductive layer to expose a portion of the underlying resistive layer, the exposed portion of the underlying resistive layer forming one of the isolation resistors. The exposed portion of the resistive layer may be spaced less than 50 μm from the via to which it is coupled. In some embodiments, a resistance value of each embedded isolation resistor is less than 50 ohms. In certain embodiments, the multiple arrays of conductive vias include a second array of conductive vias, and the multiple arrays of contact pads include a second array of contact pads, each via in the second array of conductive vias terminating at and electrically connecting to a corresponding contact pad in the second array of contact pads, the second array of contact pads being connected to the first group of conducive traces through the second array of conductive vias, where the circuit board is configured so that a monitoring device can be connected to the second array of contact pads for monitoring signals on the second array of contact pads.

In some embodiments, the multiple arrays of conductive vias include a third array of conductive vias being insulated from one another, and the multiple arrays of contact pads include a third array of contact pads, each via in the third array of conductive vias terminating at and electrically connecting to a corresponding contact pad in the third array of contact pads, the third array of contact pads being connected to a second group of the conducive traces through the third array of conductive vias, where the circuit board is configured so that a first integrated circuit can be mounted on and electrically connected to the first array of contact pads, and a second integrated circuit can be mounted on and electrically connected to the third array of contact pads. The first array of conductive vias may include through-vias connecting the first array of contact pads disposed on a first surface of the circuit board to corresponding contact pads in an array of contact pads disposed on a second surface of the circuit board opposite the first surface. The circuit board may include a plurality of interconnect layers stacked on top of one another, each interconnect layer being insulated from an adjacent interconnect layer, where the conductive traces include multiple groups of conductive traces, each group of conductive traces being disposed in a different one of the plurality of interconnect layers, the conductive traces in each group of conductive traces extending along the same plane, where the isolation resistors are disposed in a first one of the plurality of interconnect layers, and each of the conductive traces in the group of conductive traces disposed in the first one of the plurality of interconnect layers includes a conductive upper layer and a resistive lower layer.

In embodiments, a routing apparatus for monitoring an entire communication bus in operation includes a printed circuit board (PCB) having first and second arrays of contact pads, and an interposer having third, fourth and fifth arrays of contact pads, the third and fourth arrays of contact pads being disposed on opposing surfaces of the interposer, the third array of contact pads being electrically connected to the first array of contact pads. The routing apparatus may further include a first integrated circuit mounted on the second array of contact pads, and a second integrated circuit mounted on the fourth array of contact pads. The interposer may include a first group of conductive traces insulated from one another, a first array of conductive vias extending perpendicularly to the first group of conductive traces, the first array of conductive vias including through-vias connecting the third array of contact pads to corresponding contact pads in the fourth array of contact pads, the vias in the first array of conductive vias being arranged such that any two adjacent vias in a row of vias extending along any given dimension in the first array of conductive vias are equally spaced from each other, and isolation resistors embedded within the first array of conductive vias such that each isolation resistor is disposed between at least two adjacent vias in the first array of conductive vias, each of the conductive traces in the first group of conductive traces being coupled to a different conductive via in the first array of conductive vias through one of the isolation resistors, and each isolation resistor being disposed closer to the conductive via to which the isolation resistor is coupled than all other conductive vias surrounding the isolation resistor, each isolation resistor being configured to produce a copy of a signal flowing through the conductive via that is coupled to one end of the isolation resistor on the conductive trace that is coupled to an opposite end of the isolation resistor.

In certain embodiments, the interposer may further include a second array of conductive vias, each via in the second array of conductive vias terminating at and electrically connecting to a corresponding contact pad in the fifth array of contact pads, the fifth array of contact pads being connected to the first group of conducive traces through the second array of conductive vias, where the interposer is configured so that a monitoring device can be connected to the second array of contact pads for monitoring signals on the second array of contact pads. The PCB may include a second group of conductive traces connecting the first array of contact pads to the second array of contact pads through third and fourth arrays of conductive vias, where the first, second, third and fourth arrays of contact pads, the first, third and fourth arrays of conductive vias and the second group of conductive traces form a communication bus through which the first and second integrated circuits communicate with one another, and during operation, each conductive trace in the first group of conductive traces carries a copy of a bus signal propagating through a corresponding one of the first array of conductive vias so that the entire communication bus can be simultaneously monitored on the fifth array of contact pads. The first integrated circuit may include a plurality of interconnect terminals electrically connected to a corresponding contact pad in the first array of contact pads, where each via in the first array of conductive vias extends directly under a corresponding one of the plurality of interconnect terminals of the first integrated circuit.

In some embodiments, a printed circuit board (PCB) for monitoring an entire communication bus in operation includes first, second and third arrays of contact pads. The PCB may include first, second and third arrays of conductive vias, each via in the first array of conductive vias terminating at and electrically connecting to a corresponding contact pad in the first array of contact pads, each via in the second array of conductive vias terminating at and electrically connecting to a corresponding contact pad in the second array of contact pads, and each via in the third array of conductive vias terminating at and electrically connecting to a corresponding contact pad in the third array of contact pads. The PCB may further include first and second integrated circuits mounted on the first and third arrays of contact pads, respectively. The PCB may also include conductive traces insulated from one another, and isolation resistors embedded within the first array of conductive vias such that each isolation resistor is disposed between at least two adjacent vias in the first array of conductive vias, where the conductive traces include a first group of conductive traces, each of the conductive traces in the first group of conductive traces being coupled to a different conductive via in the first array of conductive vias through one of the isolation resistors, and each isolation resistor being disposed closer to the conductive via to which the isolation resistor is coupled than all other conductive vias surrounding the isolation resistor, each isolation resistor being configured to produce a copy of a signal flowing through the conductive via that is coupled to one end of the isolation resistor on the conductive trace that is coupled to an opposite end of the isolation resistor, where the vias in the first array of conductive vias are arranged such that any two adjacent vias in a row of vias extending along any given dimension in the first array of conductive vias are equally spaced from each other.

The second array of contact pads may be connected to the first group of conducive traces through the second array of conductive vias, where the PCB is configured so that a monitoring device can be connected to the second array of contact pads for monitoring signals on the second array of contact pads. In embodiments, the first and third arrays of contact pads, the first and third arrays of conductive vias and the second group of conductive traces form a communication bus through which the first and second integrated circuits communicate with one another, and during operation, the first group of conductive traces carries a copy of each bus signal propagating through the communication bus so that the entire communication bus can be simultaneously monitored on the second array of contact pads. The PCB may further include a plurality of interconnect layers stacked on top of one another, each interconnect layer being insulated from an adjacent interconnect layer, where the conductive traces include multiple groups of conductive traces, each group of conductive traces being disposed in a different one of the plurality of interconnect layers, the conductive traces in each group of conductive traces extending along the same plane, where the isolation resistors are disposed in a first one of the plurality of interconnect layers, and each of the conductive traces in the group of conductive traces disposed in the first one of the plurality of interconnect layers includes a conductive upper layer and a resistive lower layer.

In certain embodiments, the PCB may also include a plurality of interconnect layers stacked on top of one another, each interconnect layer being insulated from an adjacent interconnect layer, where the conductive traces include multiple groups of conductive traces, each group of conductive traces being disposed in a different one of the plurality of interconnect layers, the conductive traces in each group of conductive traces extending along the same plane, where the isolation resistors are disposed in two or more of the plurality of interconnect layers. The first integrated circuit may include a plurality of interconnect terminals electrically connected to a corresponding contact pad in the first array of contact pads, where each via in the first array of conductive vias extends directly under a corresponding one of the plurality of interconnect terminals of the first integrated circuit.

A better understanding of the nature and advantages of embodiments of the present invention may be gained with reference to the following detailed description and the accompanying drawings.

BRIEF DESCRIPTION OF THE DRAWINGS

FIG. 6 is a simplified diagram illustrating a printed circuit board (PCB) configured to monitor a communication bus through which a memory device and a microprocessor communicate with one another, according to embodiments of the present invention.

FIG. 7 is a simplified diagram illustrating a detailed view of a portion of the PCB in FIG. 6, according to embodiments of the present invention.

DETAILED DESCRIPTION

Figure 1:
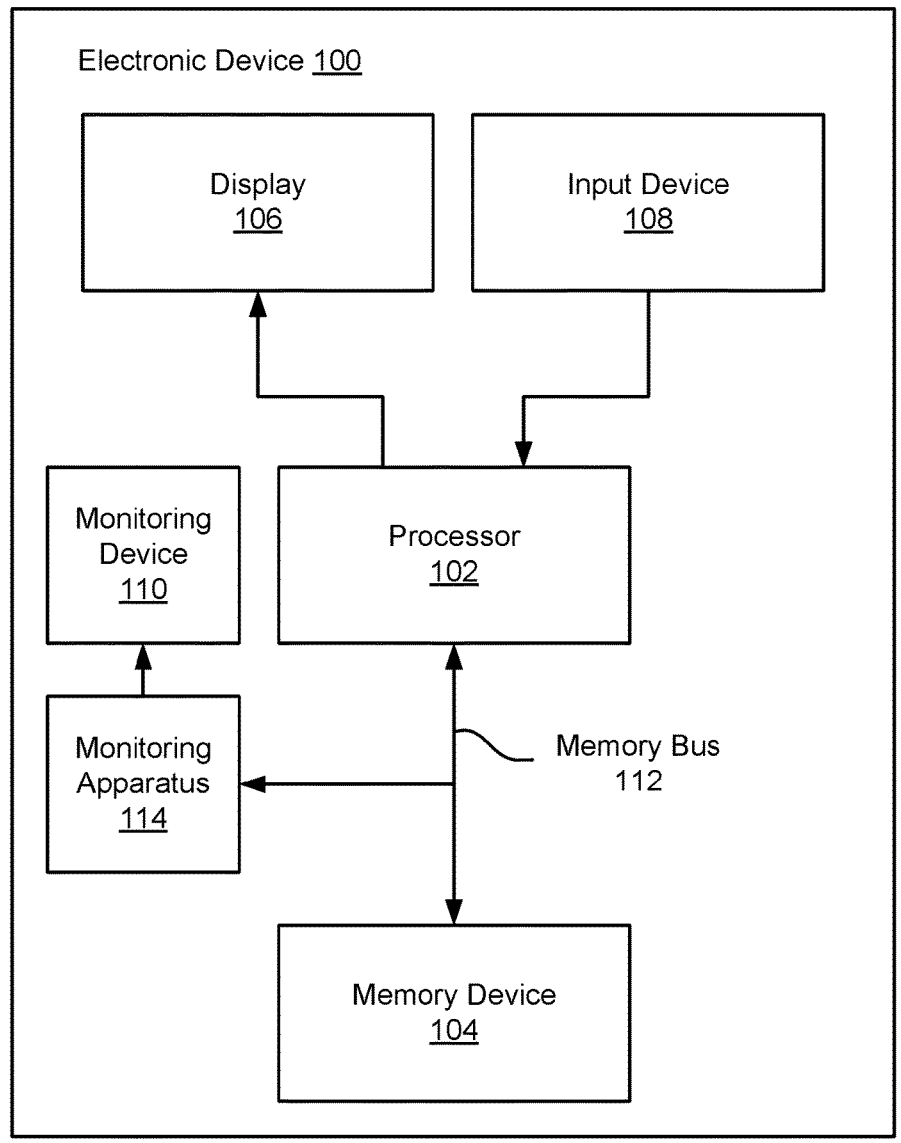
FIG. 1 is a simplified block diagram illustrating an electronic device, according to embodiments of the present invention.

Embodiments for monitoring the entirety of a communication bus through which electronic components communicate are described. The monitoring technique uses isolation resistors configured to provide a quality copy of signals transmitted on the communication bus. A monitoring device, such as a diagnostic tool (e.g., a logic analyzer) may use the signal copies to monitor the communications on the communication bus. The signal copies are generated without adversely impacting the integrity of the original signals propagating through the communication bus. Additionally, the monitoring technique uses isolation resistors that are embedded in an array of tightly packed vias without requiring the spacing between vias to be increased.

The monitoring technique may be implemented in any circuit board capable of routing signals to and/or from an electronic component (such as an integrated circuit) or between electronic components mounted on the circuit board. Printed circuit boards (PCBs), interposers, probe adaptors and circuit cards are some examples of circuit boards. It is noted that while interposers and PCBs are used herein to describe the monitoring technique, the implementation of the technique is not limited only to these two types of circuit boards. According to an embodiment, the electronic component may be a memory device, such as a dynamic random access memory (DRAM) device. The memory device may be coupled to a processor through a memory bus disposed within a circuit board. The memory bus may be made up of a series of vias and conductive traces that route signals between the processor and the memory device. To monitor the entire memory bus in operation, a monitoring apparatus according to embodiments may be coupled to the memory bus. To enable monitoring of the memory bus, an array of resistors and a network of monitoring conductive traces may be embedded in the circuit board. The embedded resistors may be configured to electrically isolate the network of monitoring conductive traces from an array of vias. The array of vias may form part of the memory bus through which the processor and the memory device communicate. The embedded isolation resistors allow a quality copy of the signals propagating through the communication bus be generated in the network of monitoring conductive traces.

The embedded isolation resistors may have a resistance value suitable to prevent the monitoring conductive traces from significantly distorting the original signal on the memory bus. Additionally, the size, dimension and material used to form the embedded resistors allow them to be positioned in between tightly packed array of vias. For instance, an embedded resistor may be positioned between, and surrounded by, a plurality of vias, as will be discussed further herein. In embodiments, all or a majority of the embedded resistors are positioned within the array of vias. The embedded resistors may be configured such that the original layout of the vias for the memory bus is not compromised or changed in any way. Furthermore, the resistors may be implemented so as to minimize changes to the process by which the circuit board is formed.

In embodiments, the isolation resistors and the corresponding monitoring traces may be embedded in an interposer that is a separate structure from the PCB on which the processor is mounted. In alternative embodiments, the isolation resistors and the corresponding monitoring traces may be embedded in a PCB containing the memory bus. The details of these configurations are discussed in more detail below.

An electronic device may be any device containing integrated circuits and semiconductor devices that can be programmed and designed to perform specific functions. As an example, an electronic device may be a computer, tablet, notebook, laptop, smart phone, smart watch, and the like. The electronic device may contain various electronic components that communicate with one another to perform specific functions. According to embodiments, a monitoring technique may be implemented to monitor one or more electrical components in operation. An exemplary electronic device in which the monitoring technique may be implemented is shown in FIG. 1.

FIG. 1 illustrates an exemplary electronic device 100. Electronic device 100 may contain several electronic components. For instance, electronic device 100 may include processor 102, memory device 104, display 106, and input device 108. During operation, processor 102 may receive inputs from input device 108, perform calculations based upon the inputs from input device 108 by accessing memory device 104, and subsequently outputting a result to display 106. Processor 102 may access memory device 104 through a memory bus 112. Proper operation of memory bus 112 may be crucial to the proper operation of electronic device 100. Thus, monitoring of the entire memory device 104 in operation may be useful for a variety reasons, such as diagnostic purposes or optimization of operating conditions for memory device 104 and/or processor 102.

According to embodiments, a monitoring technique may be implemented to monitor the entire bus 112 in operation. Monitoring apparatus 114 may be configured to tap signals flowing between processor 102 and memory device 104 through memory bus 112. As an example, monitoring apparatus 114 may be electrically coupled to memory bus 112. When coupled, monitoring apparatus 114 may generate a copy of the bus signals and provide the copy of the bus signals to monitoring device 110. Monitoring device 110 may receive and manipulate the bus signal copies for various purposes. In some embodiments, monitoring device 110 may be an FPGA, and in other embodiments, monitoring device 110 may be a diagnostic device such as a logic analyzer or an oscilloscope that is external to electronic device 100.

Memory bus 112 may be composed of an array of conductive paths that communicatively couple processor 102 with memory device 104. Although illustrated as a single line in FIG. 1, memory bus 112 may include a plurality of individual conductive paths that couple to respective contact pads of processor 102 and memory device 104. Details of such coupling are discussed with reference to FIG. 2.

Figure 2:
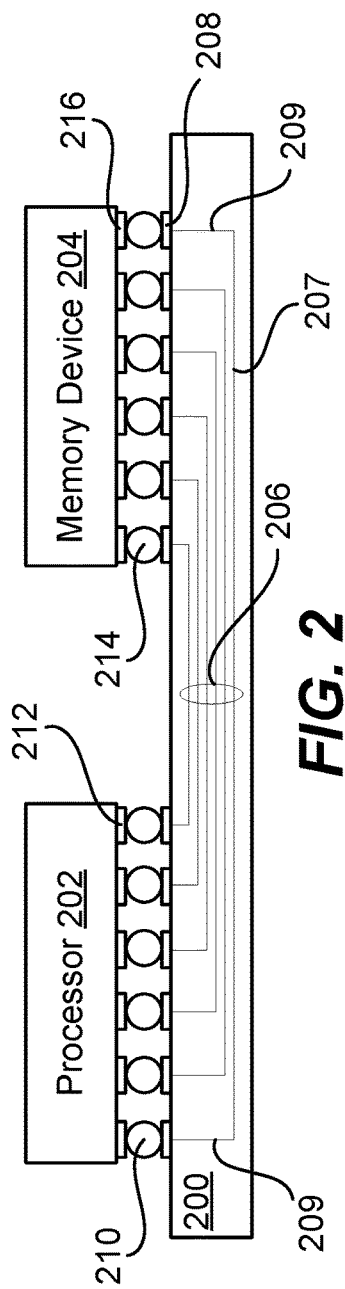
FIG. 2 is a simplified diagram illustrating a processor coupled to a memory device by a memory bus, according to embodiments of the present invention.

FIG. 2 is a simplified diagram illustrating an exemplary memory bus 206 coupling processor 202 to memory device 204. Operation of memory bus 206 may be similar to the operation of memory bus 112 discussed with reference to FIG. 1. Memory bus 206 is disposed within PCB 200, and may contain a plurality of conductive lines. The conductive lines may include a series of vertically extending vias 209 and horizontally extending traces 207 that route signals between processor 202 and memory device 204. Although the conductive lines are shown as a series of simple lines having one-to-one connections, it is to be appreciated that the conductive lines in memory bus 206 may be routed differently. In some embodiments, PCB pads 208 may be coupled to respective vias 209 of memory bus 206. Additionally, PCB pads 208 may be coupled to a set of processor pads 212 and a set of memory device pads 216. Each set of pads 212 and 216 may be a landing grid array (LGA) for coupling with respective PCB pads 208. In some embodiments, pads 212 and 216 may couple with PCB pads 208 via a plurality of bumps 210 and 214, respectively. Bumps 210 and 214 may be any suitable interconnection structure, such as, but not limited to, a solder bump and a copper bump. In some embodiments, bumps 210 and 214 and corresponding pads 212 and 216 may be arranged in a two-dimensional array, as shown in FIG. 3.

Figure 3:
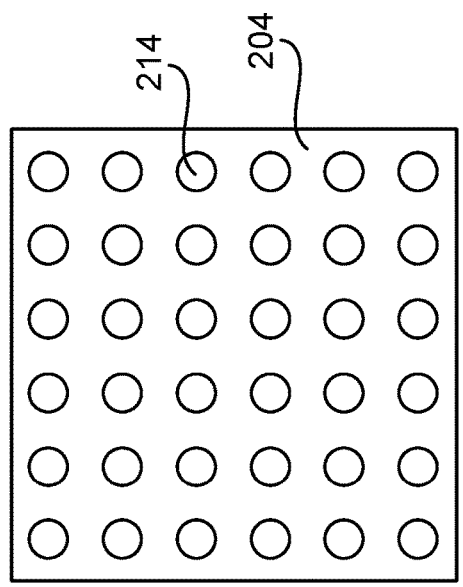
FIG. 3 is a simplified diagram illustrating a top-down view of an array of bumps corresponding to the interconnection terminals of a memory device, according to embodiments of the present invention.

FIG. 3 is a simplified diagram illustrating a top-down view of an arrangement of bumps 214 for memory device 204. Bumps 214 may be a ball grid array (BGA) arranged in a M×N array, where M and N are integers. Locations of each bump 214 may correspond with a respective memory pad 216, not shown in FIG. 3. Accordingly, the LGA (e.g., memory pads 216) may also be arranged in the same M×N array and pattern. As the performance of memory device 204 increases and its dimensions decrease, pads 216 are disposed closer to one another.

During memory device operation, signals may flow through bumps 210 and 214 and memory bus 206. For instance, signals may be sent from processor 202 to memory device 204 to retrieve data from or write data to memory device 204. To monitor memory device 204 in operation, signals transmitting to and from memory device 204 may be observed by sampling the signals flowing into and out of memory device 204.

According to embodiments, a monitoring technique may be implemented to monitor signals flowing into and out of memory device 204. The entire memory bus 206 may be monitored in operation without affecting the integrity of the signals propagating through memory bus 206.

An interposer may be an electrical interface routing structure disposed between two devices. For example, an interposer may be disposed between a memory device and a processor to route electrical signals between them. In embodiments, the interposer may also provide a venue through which signals transmitted between the two devices may be monitored, as will be described with reference to FIGS. 4 and 5.

Figure 4:
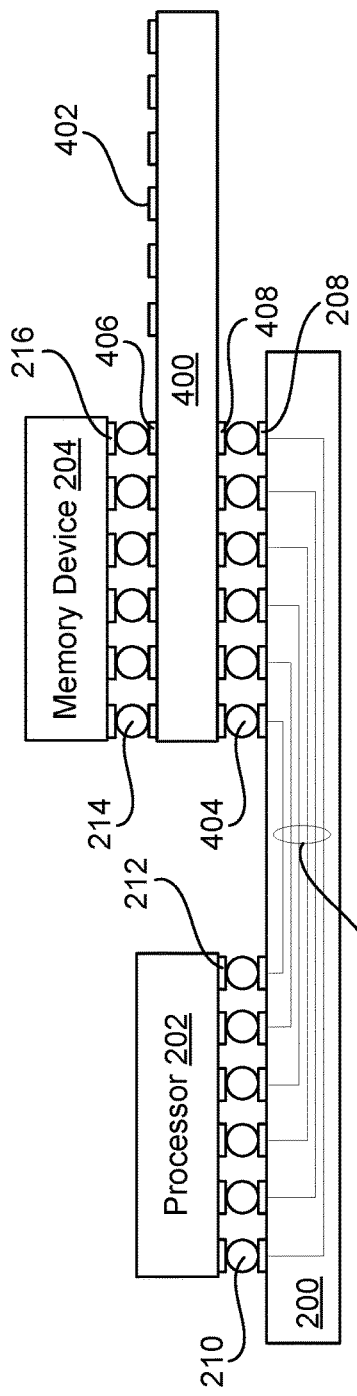
FIG. 4 is a simplified diagram illustrating an interposer configured to monitor a communication bus through which a memory device and a microprocessor communicate with one another, according to embodiments of the present invention.

FIG. 4 is a simplified diagram illustrating an interposer 400 configured to enable monitoring of memory bus 206. Interposer 400 may be a separate structure that is positioned along an electrical path between memory device 204 and processor 202 as shown in FIG. 4. For instance, interposer 400 may be disposed between a motherboard, e.g., PCB 200, and memory device 204, and configured to extract copies of signals transmitted between processor 202 and memory device 204. Interposer pads 406 and 408 on opposite surfaces of interposer 400 couple interposer 400 to memory pads 216 through bumps 214 and to PCB pads 208 through bumps 404, respectively.

Interposer 400 may be positioned at a point along the electrical path between memory device 204 and processor 202 so that the signal copies generated in interposer 400 more closely resemble the signals that memory device 204 receives and sends during operation. Thus, interposer 400 may be positioned close to memory device 204, as shown in FIG. 4

In embodiments, interposer 400 may include monitoring pads 402. Monitoring pads 402 may be a series of contact pads where copies of the memory bus signals may be monitored. Monitoring pads 402 may be exposed on a surface of interposer 400 for coupling with another device (not shown). The device coupled to monitoring pads 402 may be an external device, such as a debugging tool (e.g., a logic analyzer or an oscilloscope) or an IC such as an FPGA that is configured to monitor the memory bus signal copies.

Interposer 400 is configured to route copies of signals flowing between processor 202 and memory device 204 to monitoring pads 402. According to embodiments, copies of the signals flowing between memory device 204 and processor 202 are provided to monitoring pads 402 without affecting the integrity of the original bus signals. An array of embedded resistors may be positioned within interposer 400 in a particular manner so as to enable such non-intrusive monitoring, as discussed in more detail with reference to FIG. 5.

Figure 5:
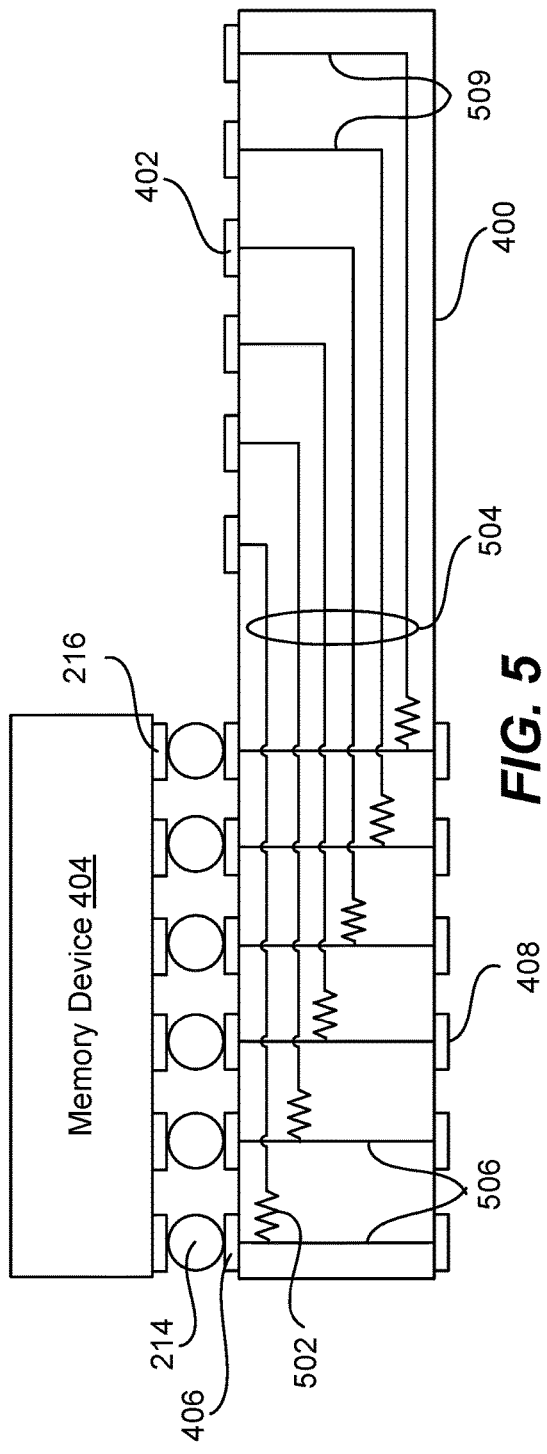
FIG. 5 is a simplified diagram illustrating a detailed view of the interposer in FIG. 4, according to embodiments of the present invention.

FIG. 5 is a simplified diagram illustrating a detailed view of interposer 400, according to embodiments of the present invention. As shown, interposer 400 includes an array of vias 506 for routing electrical signals between memory device 404 and PCB 202. In embodiments, vias 506 may be through-vias constructed to allow electrical signals to transmit directly through interposer 400 between opposing pads 406 and 408. For instance, the through-vias may be constructed as a vertical structure that spans the entire thickness of interposer 400. Although embodiments herein discuss vias 506 as through-vias, any other suitable conductive structures for routing signals may be used instead.

Interposer 400 may also include embedded resistors 502 and associated traces 504 that route signal copies. Embedded resistors 502 may be coupled between vias 506 and corresponding traces 504. Traces 504 may in turn be connected to corresponding monitoring pads 402 through vias 509. Embedded resistors 502 are carefully designed so as to electrically isolate traces 504 from vias 506 during operation. The electrical isolation provided by embedded resistors 502 prevents traces 504 from interfering with bus signals transmitted through vias 506. Embedded resistors 502 enable copies of the bus signals transmitting through vias 506 to be provided on associated isolated traces 504 without adversely impacting the original bus signals. The signal copies on isolated traces 504 may then be provided to corresponding monitoring pads 402 by vias 509.

In embodiments, embedded resistors 502 are positioned as close to vias 506 as possible. For example, embedded resistors 502 are positioned such that they are directly adjacent to, if not in contact with, vias 506. Positioning embedded resistors 502 directly adjacent to vias 506 minimizes signal reflection along an electrical path between vias 506 and embedded resistors 502. Signal reflection may cause distortion and/or disruption of the original bus signals. These effects are more dramatic for modern memory devices due to their low operational voltage and high operational speeds. Thus, by placing embedded resistors 502 as close to vias 506 as possible, according to embodiments herein, little to no signal reflection occurs and distortion of the original signal may be avoided. In embodiments, embedded resistors 502 are positioned less than 50 µm away from vias 506. In certain embodiments, embedded resistors 502 are positioned less than 40 µm away from vias 506. It is noted that in some embodiments, the proximity of resistors 502 to vias 506 is limited by the manufacturing process. As the manufacturing process for PCB and other similar boards continues to evolve, the separation between resistors 502 and vias 506 may be substantially reduced or completely eliminated.

In addition to positioning embedded resistors 502 in close proximity to vias 506, embedded resistors 502 may also be configured to have a certain resistance value suitable for electrically isolating traces 504 from vias 506 while also allowing for a copy of the original signals to be generated on isolated traces 504. The resistance value of embedded resistors 502 may be tailored according to the voltage and speed of signals transmitting through vias 506. The resistance value of embedded resistors 502 may be selected so as to allow copies of the original signals to be generated on isolated traces 504. However, the resistance value should not be so high as to result in generation of low quality copies of the original signal. Low quality copies may not be an accurate representation of how memory device 204 is actually operating. On the other hand, the resistance value should not be so low as to cause reflection of the bus signal. By selecting the proper resistance value for embedded resistors 502, memory device 204 may be monitored without affecting its operation. In embodiments, the resistance value of embedded resistors 502 is less than 50 ohms. In certain embodiments, the resistance value of embedded resistors 502 is less than 35 ohms, e.g., approximately 30 ohms with a tolerance of 10% (i.e., 27 to 33 ohms.

FIG. 5 shows the lengths of isolated traces 504 to be roughly equal. This is preferred so that any timing skews of the signal copies are not attributed measurement error. It is also preferred to position the memory device as closely to the monitoring pads 402 as possible so that the length of traces 504 is kept to a minimum. However, the actual implementation may not allow for equal length traces 504 or placing the memory device close to the monitoring pads. In such cases, depending on the electronic component being monitored, the signal copies need to be carefully allocated to appropriate length traces. For example, in the case of a memory device, such as a DDR DRAM, the DQ signals should be routed through shorter traces, and the CA, CS and CKE signals routed through longer traces. The DQ signals should be routed through shorter traces because the DQ signals, which may be sampled on both edges of the clock, are more sensitive to losses and distortion than the other signals, which may be sampled on only the rising edge of the clock.

The array of vias 506 and associated isolated traces 504, as well as embedded resistors 502 may be disposed within one or more insulating layers (not shown) that serve to isolate vias 506, traces 504, and embedded resistors 502. The insulating layers may also provide structural rigidity and protection of vias 506, traces 504, and embedded resistors 502.

FIGS. 6 and 7 illustrate an embodiment in which the monitoring technique is implemented in a PCB. PCB 600 is similar to PCB 200 but includes certain modifications to enable monitoring of memory bus 206. These modifications may include use of embedded resistors and associated isolated traces that are similar to embedded resistors 502 and their associated isolated traces 504 discussed above with reference to FIG. 5. Processor 202 and memory device 204 may be coupled to PCB 600 in a similar manner to that described above with reference to FIG. 2. As in FIG. 2, memory bus 206 routes signals between processor 202 and memory device 204 through laterally extending traces 207 and vertically extending vias 209a.

PCB 600 includes a surface area designated for monitoring pads 602 that may be arranged in an array configuration. Similar to monitoring pads 402, monitoring pads 602 provide contact pads to which another device (not shown) may be coupled for monitoring memory bus 206. Copies of the memory bus signals may be provided on monitoring pads 602 via embedded resistors and associated isolated traces as discussed in more detail below with reference to FIG. 7. The device coupled to monitoring pads 402 may be an external device, such as a debugging tool or an IC such as an FPGA that may be configured to monitor the memory bus.

FIG. 7 is a detailed cross section view of a portion of PCB 600 according to embodiments of the present invention. PCB 600 includes embedded resistors 702, associated isolated traces 704, and monitoring pads 602 that are interconnected in a similar manner to those in FIG. 5. Embedded resistors 702 and associated isolated traces 704 may have similar properties and structures as embedded resistors 502 and traces 504 in FIG. 5. However, unlike interposer 400 in FIGS. 4 and 5 which includes through-vias 506, PCB 600 may not have through-vias because memory device 240 and processor 202 may be mounted on the same side of PCB 600. It is noted that while in FIG. 6 these two ICs are mounted on the same side of PCB 600, the monitoring technique is not limited to such configuration. The IC components may be mounted on different sides of PCB 600 in which case through-vias may or may not be used to interconnect the ICs.

As shown in FIG. 7, memory bus 206 includes laterally extending traces 207 that are connected to memory device 204 through vias 209a. Embedded resistors 702 coupled to corresponding vias 209a electrically isolate memory bus 206 from isolated traces 704 that carry signal copies of memory bus 206. As with the FIG. 5 embodiment, embedded resistors 702 are positioned as close to vias 209a as possible for the reasons stated above. In some embodiments, embedded resistors 702 are positioned less than 50 µm away from vias 209a. Isolated traces 704 carrying signal copies are connected to monitoring pads 602 by vias 209b. Reference numeral 209a is used to reference the vias that form part of bus 206 (i.e., those vias in FIG. 7 located to the left of resistors 702), and reference numeral 209b is used to reference vias that connect isolated traces 704 to monitoring pads 602 (i.e., those vias in FIG. 7 located to the right of resistors 702). As illustrated in FIG. 7, a given trace 207a in memory bus 206, its associated embedded resistor 702a and the corresponding isolated trace 704a may all be formed at the same PCB interconnect layer. However, these three connected elements may be formed at different PCB interconnect layers. For example, trace 207a and its associated resistor 207a may be formed in one PCB interconnect layer, and isolated trace 704a may be formed in a different interconnect layer. Alternatively, trace 207a may be formed in one PCB interconnect layer, and embedded resistor 207a and isolated trace 704a may be formed in a different level. It also is possible to form these three elements in three different PCB interconnect layers. Also, although the embedded resistors 702 are shown at different interconnect layers, they all can be incorporated in one interconnect layer. This is made possible by the specific design of the resistors. It is noted that, from the manufacturing perspective, it may be desirable to dispose the embedded resistors in one or only few interconnect layers. This would minimize the number of processing steps that need to be modified in order to incorporate the embedded resistors and their associated traces in the PCB.

Although PCB 600 in FIGS. 6 and 7 include monitoring pads 602, it is to be appreciated that PCB 600 may not have monitoring pads 602 in alternative embodiments. Instead, isolated traces 704 may route the bus signal copies to an embedded device or to another electrical connection system without using external pads.

As described earlier, in order for embedded resistors 502 (FIG. 5) and 702 (FIG. 7) to be positioned as close to corresponding vias 506 and 209a as possible and to have the desired resistance value, embedded resistors 502 and 702 may be designed to have a specific structure and may be made of a particular material. The structure and material of embedded resistors 502 and 702 advantageously allow these resistors to be disposed within an array of tightly packed vias, as will be discussed in more detail herein.

Figure 8A:
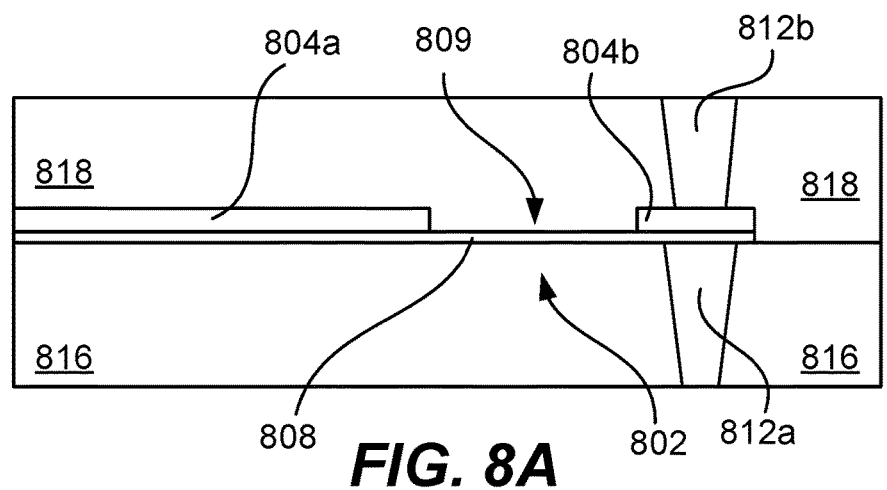
FIG. 8A is a cross-sectional view showing an implementation of an embedded resistor coupled to a through-via, according to embodiments of the present invention.

FIG. 8A is a cross-sectional view of an exemplary embedded resistor 802 according to embodiments of the present invention. Embedded resistor 802 corresponds to embedded resistors 502 and 702 discussed in FIGS. 5 and 7, respectively. In embodiments, embedded resistor 802 may be formed of a portion of a resistive layer 808 that extends under a conductive layer 804. A gap 809 formed in trace 804 breaks up conductive layer 804 into portions 804a and 804b. Portion 804a may form a conductive trace that extends along an electrical path for routing a signal copy to a monitoring pad, such as monitoring pads 402 and 602 in FIGS. 4 and 6. The portion of resistive layer 808 exposed through gap 809 forms resistor 802. Conductive trace 804a may correspond to one of isolated traces 704 (FIG. 7) which carries a copy of a memory bus signal. Thus, embedded resistor 802 electrically isolates conductive trace 804a from via 812. This minimizes the impact of trace 804a on the integrity of the memory bus signal propagating through via 812, while allowing a quality copy of the memory bus signal propagating through via 812 to be provided on trace 804a.

In embodiments, resistive layer 808 may be a layer of plating attached to conductive trace 804. Similar to resistive layer 808 of embedded resistor 802 in FIGS. 8A-8B, current flowing through conductive line 804 must pass through the portion of resistive layer 808 extending between portions 804a and 804b of conductive trace 804.

In certain embodiments, via 812 may be formed of two vias 812a and 812b stacked upon one another. In some embodiments, portion 804b and a portion of resistive layer 808 disposed between vias 812a and 812b. Either one of vias 812a and 812b may make contact with portion 804b such that signals transmitting through via 812 may be copied onto trace 804a. Signals that transmit through via 812 may transmit vertically through the portion of resistive layer 808 and portion 804b without having its signal quality significantly affected by resistive layer 808 and portion 804b.

Figure 8B:
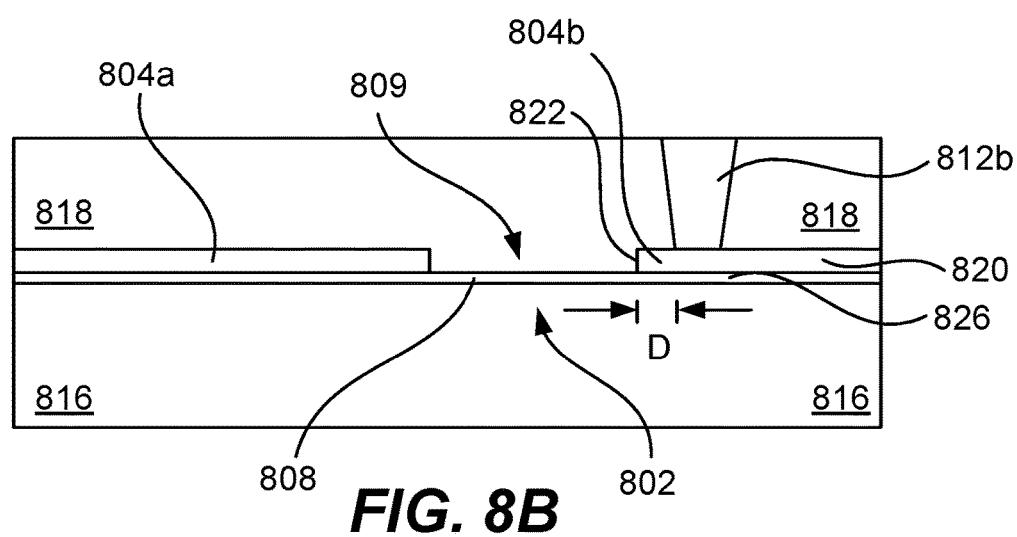
FIG. 8B is a cross-sectional view of showing an implementation of an embedded resistor coupled to a via, according to embodiments of the present invention.

In an alternative embodiment shown in FIG. 8B, via 812 may be formed of a single via, such as only via 812b, that extends up from embedded resistor 802 and couples to portion 804b of conductive layer 804. In such embodiments, a portion of conductive layer 804 may be utilized as a conductive trace 820 to route signals between electrical components, such as a memory device and a processor, through via 812b, and thus may correspond to conductive traces 207 in FIG. 7. One skilled in the art understands that there may be many ways to couple via 812b to both embedded resistor 802 and conductive trace 820, and that the configuration shown in FIG. 8B is merely one way of making such a coupling. Further, while conductive traces 804a and 820 and embedded resistor 802 are all shown in FIG. 8B to be in the same PCB interconnect layer, conductive trace 820 may be formed in a different interconnect layer so that it connects to via 812b at a different interconnect layer.

In some embodiments, embedded resistor 802 may be disposed between two insulating layers. For instance, embedded resistor 802 may be disposed between a first insulating layer 816 and a second insulating layer 818. These insulating layers may electrically isolate embedded resistor 802 and trace 804a from surrounding conductive structures. Embedded resistor 802 may be positioned as close to via 812 as possible, for reasons stated above. In other words, a closest edge 822 of gap 809, or a closest point of gap 809, may be a distance D of less than 50 μm away from a bottom of via 812, as shown in FIG. 8B.

During operation, signals may be transmitted through via 812. The signals may include clock, address, data, command, or any other signal transmitted during operation of an electrical component such as a memory device. According to embodiments, these signals may be copied onto conductive traces, such as trace 804a, by associated embedded resistors, such as resistor 802. The copied signal may then be received by a monitoring device (not shown) that is electrically coupled to isolated conductive traces such as trace 804a.

As discussed herein with respect to FIG. 5, embedded resistor 802 may be configured to have a specific resistance value suitable for generating a quality copy of a signal transmitting through via 812, while also preventing disruption of the original bus signal. The resistance value of embedded resistor 802 may be tailored by altering the dimensions of embedded resistor 802. For instance, depending on the material and sheet resistance of resistive layer 808, a thickness of resistive layer 808 may be adjusted to achieve different resistance values. Thicker resistive layers 808 may result in lower resistance values, and vice versa. In some embodiments, the thickness of resistive layer 808 ranges between 600 to 1000 Å. In certain embodiments, the thickness is approximately 800 Å. In addition to thickness, the length and width of embedded resistor 802 may also be adjusted to obtain the desired resistance value. However, the space constraints in the array of vias limit the flexibility in adjusting the width and length of the resistors. These factors are more fully discussed further below.

Figure 9:
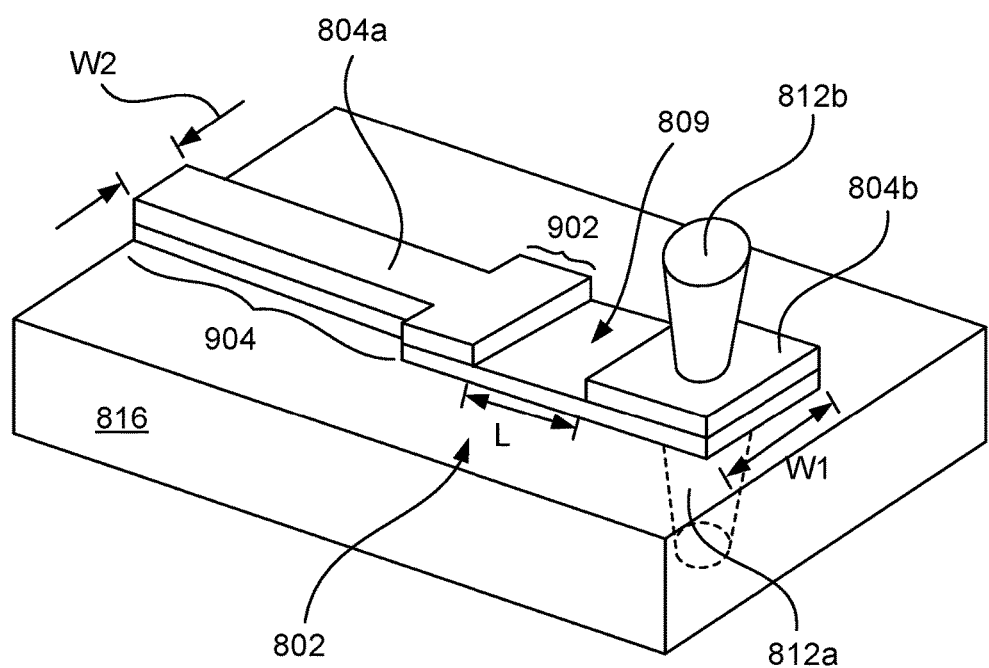
FIG. 9 is an isometric view of an embedded resistor, according to embodiments of the present invention.

FIG. 9 illustrates an isometric view of embedded resistor 802, according to an embodiment of the present invention. Embedded resistor 802 may have a length L and a width W1 which together with the thickness and material selected for resistive layer 808 define a resistance value that: (a) enables a high quality copy of the bus signal flowing through via 812b to be provided on conductive trace 804a, while electrically isolating trace 804a from via 924 so as to minimize any adverse impact of conductive trace 804a on the bus signal flowing through via 812b, and (b) allows embedded resistor 802 to be placed within an array of tightly packed vias.

It is to be appreciated that conductive trace 804a may have a shape that varies, as shown in FIG. 9. As an example, conductive trace 804a may have a first region 902 and a second region 904. First region 902 may have a width W1 that is equal to that of embedded resistor 802. Second region 904, however, may have a width W2 that is smaller than width W1. This is because embedded resistor 802 is configured to have dimensions tailored to a target resistance value where, generally, greater lengths L result in higher resistance values, while greater widths W result in lower resistance values.

Length L may be defined by the distance between portions 804a and 804b of conductive layer 804. It may be defined this way because during operation, current travels through resistive layer 808 along the length L. Accordingly, the resistance value of embedded resistor 802 may in part be defined by the length L and width W1 of gap 809. For instance, the resistance value may be calculated by multiplying the ratio of length L to width W1 by the sheet resistance of the material used to form resistive layer 808. In one embodiment, a 30 ohms nominal resistance value is obtained using a length L equal to 0.055 mm, a width W1 equal to 0.215 mm and NiP as the material for resistive layer 808. Resistive layer 808 may be formed of any other suitable resistive material, such as, NiCr, NCAS, and CrSiO, where each resistive material may require a different length L and width W resistor to achieve a 30 ohms nominal resistance value.

In embodiments, the region of conductive trace 804a that is disposed closest to gap 809 (i.e., first region 902) may have the same width W1 as embedded resistor 802 to ensure proper implementation of embedded resistor 802. However, second region 904 may have the same width as other conductive traces in the PCB.

Although FIG. 9 illustrates portion 804b of conductive layer 804 as having a rectangular structure, embodiments are not limited to such shapes. For instance, portion 804b may have a region that is shaped as a rounded pad. In other examples, portion 804b may have an edge that is curved, as will be discussed further herein with respect to FIG. 10. Any other shape or form that enables signals transmitted through via 812 to be copied onto trace 804a that does not depart from the spirit and scope of the invention is envisioned herein.

It is to be appreciated that selecting a thickness, length L, width W1 and an appropriate material for embedded resistor 802 may be partly dictated by the location where resistor 802 is to be disposed and the surrounding structures. Thus, in order to achieve a target resistance value for embedded resistor 802, the length L and width W may be adjusted within the boundaries of the neighboring structures. This can be challenging where resistors 802 are embedded within a tightly packed array of vias, as discussed further below with respect to FIG. 10.

Figure 10:
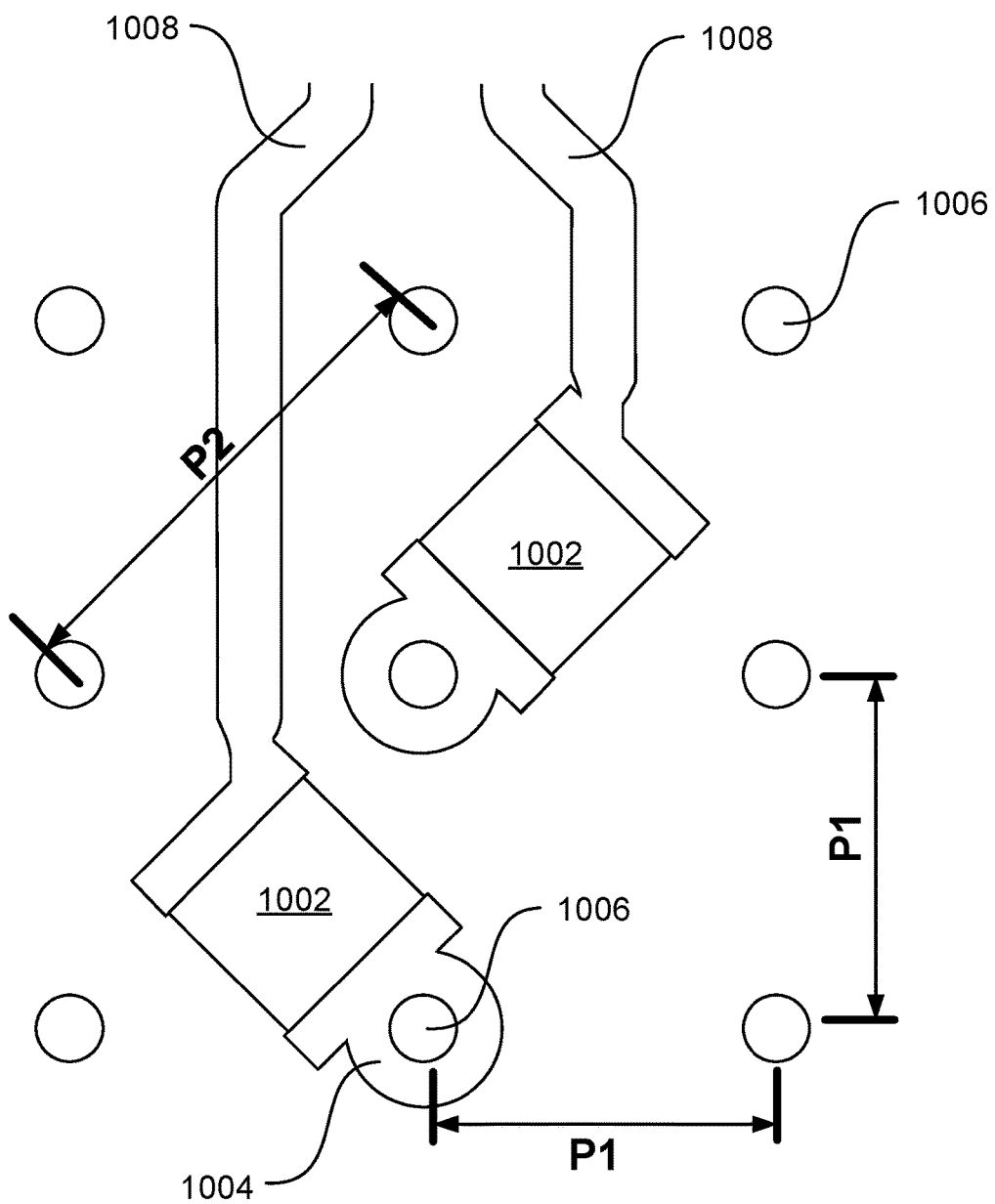
FIG. 10 is a top-view illustration of isolation resistors embedded within an array of vias, according to embodiments of the present invention.

FIG. 10 illustrates a top-down view of embedded resistors 1002 disposed in a tightly packed array of vias 1006, according an embodiment of the present invention. This view corresponds to a top view at a given interconnect layer of a circuit board. Embedded resistors 1002 may each be similar to embedded resistor 802 or 902 discussed above with reference to FIGS. 8A, 8B, and 9. In embodiments, vias 1006 may be positioned to correspond with the LGA arrangement of an electronic component, such as a memory device.

In embodiments, both a vertical and a horizontal pitch P1 of the array of vias 1006 may be between 0.35 and 0.8 mm. A diagonal pitch P2 of the array of vias 1006 may be between 0.5 and 0.9 mm. In a particular embodiment, pitch P1 may be approximately 0.5 mm and pitch P2 may be approximately 0.7 mm. Embedded resistors 1002 may have dimensions and be made of material that allows them to fit within the tight pitch of the array of vias 1006 while providing a resistance value sufficient to generate a quality copy of the bus signals transmitted through vias 1006 onto associate isolated traces 1008 without impacting the integrity of the original bus signals. In embodiments, embedded resistors 1002 and their associated traces 1008 are formed using the same two layers, as discussed above with reference to FIGS. 8A, 8B, and 9. Although FIG. 10 illustrates a 3×3 array of vias 1006, it is understood that the 3×3 array of vias 1006 may be a subset of a larger array of vias. The entire set of vias is not shown for ease of discussion and clarity.

Vias 1006 are coupled to a conductive portion 1004, such as conductive portion 804b illustrated in FIG. 9. As shown in FIG. 10, conductive portion 804b may be a shape that includes a curved sidewalls 1010 and straight sidewalls 1012. Curved sidewalls 1010 may be edges of conductive portion 1004 that outline a surface upon which via 1006 may land to make connection with corresponding embedded resistor 1002. For instance, curved sidewalls 1010 may be edges of a landing pad that is formed as part of conductive portion 1004. The landing pad allows via 1006 to electrically couple to embedded resistor 1002.

It is also to be appreciated that embodiments are not limited to just two embedded resistors disposed within an array of vias. Rather, any number of embedded resistors may be disposed within the array of vias. This is possible because embedded resistors 1002 and associated traces 1008 are designed so that they can be embedded within arrays of tightly packed vias, at either one or more multiple interconnect layers of a circuit board, with minimal change to the manufacturing process, as discussed in more detail further below. Advantageously, circuit boards with arrays of vias patterned to match particular LGA packages (so the integrated circuit LGA package can be directly mounted on the circuit board) need not be re-designed to accommodate the presence of the embedded resistors. It is noted that while FIG. 10 shows vias 1006 to be arranged in a particular pattern, the implementation is not limited as such. Many other patterns (e.g., rectangular, hexagonal, circular) are possible. In embodiments, the pattern of vias 1006 is dictated by the arrangement of the interconnection terminals (e.g., BGA pins) of the integrated circuit that is mounted on the circuit board. That is, vias 1006 are arranged in a pattern that matches the pattern of the interconnection terminals on the integrated circuit. In some embodiments, at least some of vias 1006 are arranged in an uninterrupted pattern whereby any two adjacent vias in a row of vias extending along any given dimension in the array of vias are equally spaced from each other.

Figure 11A:
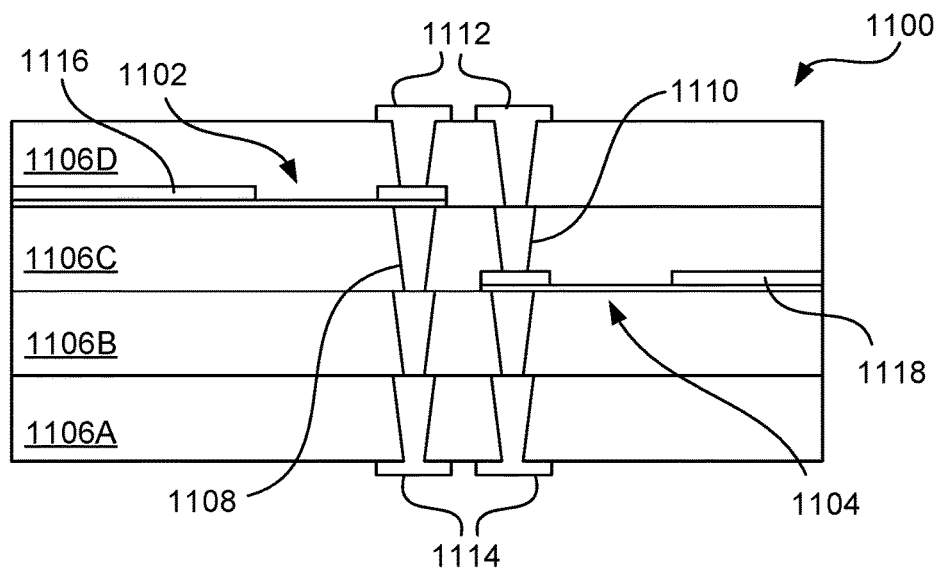
FIG. 11A is a simplified cross-sectional view of a circuit board showing two implementations of embedded resistors that are coupled to through-vias, according to embodiments of the present invention.

FIG. 11A is a simplified cross-section view of a circuit board, such as an interposer, that includes through-vias, similar to that discussed above with reference to FIGS. 4 and 5. As shown, a plurality of embedded resistors 1102 and 1104 may be disposed within a plurality of insulating layers 1106A-1106D. Embedded resistors 1102 and 1104 may be coupled to associated isolated traces 1116 and 1118, respectively. The resistor structure for embedded resistor 1102 is similar to that for resistor 802 in FIGS. 8A-8B and 9, and thus will not be described again. As shown, vias 1108 and 1110 may each be formed of more than one via arranged in a vertical orientation such that vias 1108 and 1110 operate as through-vias that extend through all insulating layers 1106A-1106D. In other embodiments, vias 1108 and/or 1110 may be a single long via that extends through insulating layers 1106A-1106D. Accordingly, pads 1112 and 1114 may be coupled to vias 1108 and 1110 such that an electronic device coupled to pads 1112 may communicate with an electronic device coupled to pads 1114. As indicated earlier, embedded resistors 1102 and 1104 and their associated traces 1116 and 1118 may be incorporated at any interconnect layer within the circuit board. Traces 1116 and 1118 carry copies of bus signals flowing through vias 1108 and 1110, respectively, and may be routed to monitoring pads (not shown) where the bus signal copies may be retrieved and used for various purposes.

Figure 11B:
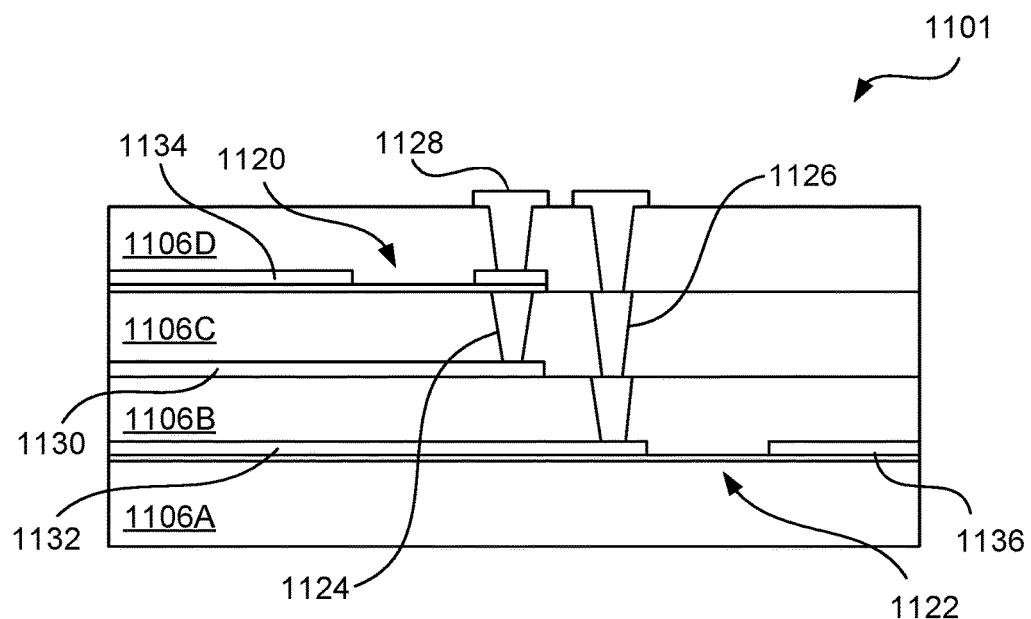
FIG. 11B is a simplified cross-sectional view of a circuit board showing two implementations of embedded resistors that are coupled to vias, according to embodiments of the present invention.

FIG. 11B is a simplified cross-section view of a circuit board, such as a PCB, in which the vias may not extend through all insulting layers, similar to that discussed above with reference to FIGS. 6 and 7. As shown, the embedded resistors may be coupled to vias that are not through-vias. FIG. 11B illustrates embedded resistors 1120 and 1122 respectively coupled to vias 1124 and 1126. The resistor structure for embedded resistor 1120 is similar to that for resistor 802 in FIGS. 8A-8B and 9, and thus will not be described again. Conductive traces 1130 and 1132 and the vias to which they connect (vias 1124 and 1126, respectively) form part of the bus that connects two IC components together. Embedded resistor 1120 functions to provide a quality copy of the bus signal propagating through trace 1130 on isolated trace 1134. Similarly, embedded resistor 1122 functions to provide a quality copy of the bus signal propagating through trace 1132 on isolated trace 1136. Isolated traces 1134 and 1136 may be routed to monitoring pads (not shown) where the bus signal copies may be retrieved and used for various purposes.

As indicated earlier, a conductive trace carrying a given bus signal, the corresponding embedded resistors and its associated isolated trace may all be formed in the same or different interconnect layers of PCB 1101. Two examples are shown in FIG. 11B. In the case of embedded resistor 1120, conductive trace 1130 carrying an original bus signal is formed in one PCB interconnect layer (i.e., the interconnect layer sandwiched by insulating layers 1106B and 1106C), while embedded resistor 1120 and its associated trace 1134 carrying a copy of the bus signal propagating through trace 1130 are formed in a different PCB interconnect layer (i.e., the interconnect layer sandwiched by insulating layers 1106C and 1106D). In the case of embedded resistor 1122, conductive trace 1132 carrying an original bus signal, embedded resistor 1122, and isolated trace 1134 carrying a copy of the bus signal propagating through trace 1132 are all formed in the same PCB interconnect layer (i.e., the interconnect layer sandwiched by insulating layers 1106A and 1106B). As shown, vias 1124 and 1126 may be formed of a plurality of vias arranged in a vertical orientation, but may also be formed of a single through-via in other embodiments as well.

FIGS. 12A-12H and FIGS. 13A-13D are cross section views showing two methods for forming exemplary circuit boards, in accordance with embodiments of the present invention. Specifically, FIGS. 12A-12H illustrate a method of forming a circuit board, such as an interposer, having an embedded resistor coupled to through-vias, and FIGS. 13A-13D illustrate a method of forming a circuit board, such as a PCB, having embedded resistors coupled to vias that may not extend all the way through the circuit board. The illustrations are arranged in a sequence, however, it is to be appreciated that the illustrated sequence is not intended to be limiting and that the illustrated method of forming the monitoring apparatus may be performed in alternative sequences.

Figure 12A:
FIGS. 12A-12H illustrate a method of forming a circuit board including embedded resistors coupled to vias, according to embodiments of the present invention.

As shown in FIG. 12A, a first via 1202 may be formed in a first insulating layer 1204. First insulating layer 1204 may be formed of an electrically insulating material such as a dielectric, or may be a starting substrate made of an insulating material. In embodiments, first via 1202 may be formed by first etching an opening within first insulating layer 1204. The opening may be formed by any suitable masking and etching techniques. As an example, a photoresist material may first be deposited and then patterned according to a specific pattern that defines the location of first via 1202. Portions of the photoresist may then be exposed and removed to define the opening for first via 1202. Portions of first insulating layer 1204 that are not covered by the photoresist may be removed by the etching process. Any suitable etching technique, such as a wet or dry etching process, may be used to form the opening.

Once the opening is formed, a conductive material may then be deposited into the opening. In embodiments, the conductive material may be deposited on at least a portion of first insulating layer 1204. The conductive material may be deposited by any suitable deposition process, such as, but not limited to, sputtering, chemical vapor deposition (CVD), and the like. The conductive material may be a metal or a doped semiconductor material. For example, the conductive material may be tungsten, aluminum, doped polysilicon, and any other material that can be turned into plasma to be deposited. Thereafter, a planarization process, such as a chemical-mechanical planarization (CMP) process, may be performed to remove material deposited on top of first insulating layer 1204.

Figure 12B:
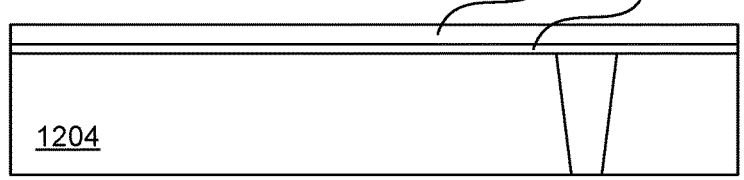

Once first via 1202 is formed, a resistive layer 1206 and a conductive layer 1208 may be formed on first insulating layer 1204 and first via 1202, as shown in FIG. 12B. Any suitable method may be used to form resistive layer 1206 and conductive layer 1208. As an example, resistive layer 1206 may be deposited on conductive layer 1208 and then laminated on first insulating layer 1204 and first via 1202. Resistive layer 1206 may be a layer of material that has resistive properties. For instance, resistive layer 1206 may be formed of NiP, NiCr, NCAS, CrSiO, or any other suitable resistive material. In embodiments, conductive layer 1208 may be formed of a conductive material, such as copper, aluminum, or tungsten. Thus, in a particular embodiment, a layer of NiP may be deposited on a copper foil and then laminated on first insulating layer 1204 and first via 1202 such that the layer of NIP forms resistive layer 1206 and the copper foil forms conductive layer 1208.

Figures 1, 2, 12C:
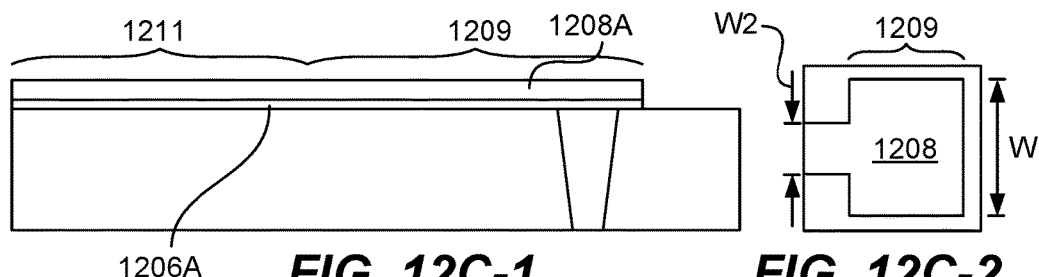

Thereafter, conductive layer 1208 and resistive layer 1206 may be patterned and etched to form an embedded resistor and a trace, according to embodiments of the present invention. Three etching processes may be used to form the embedded resistor. The first etching process may be a patterning and etching of conductive layer 1208 and its underlying resistive layer 1206 to form conductive trace 1208A with resistive layer 1206A extending underneath the entirety of conductive trace 1208A, as shown in FIGS. 12C-1 and 12C-2. Specifically, FIGS. 12C-1 and 12C-2 respectively illustrate a cross-sectional view and a top-down view after the first patterning and etching process.

As shown in FIG. 12C-1, the first etching process may include patterning and etching processes configured to etch both conductive layer 1208 and resistive layer 1206 such that conductive trace 1208A with the underlying resistive layer 1206A remain. For instance, the first etching process may consist of two processes: an initial etching process to remove portions of conductive layer 1208 and a subsequent etching process may etch resistive layer 1206. Any suitable anisotropic etching process may be used to perform the initial and subsequent etching processes. The patterning and etching process may be carried out so that conductive layer 1208A and the underlying resistive layer 1206A may have a first region 1209 and a second region 1211 that have different widths. First region 1209 may have a width W that is designed to be greater than a target width for achieving a target resistance for the embedded resistor. The greater width allows a subsequent etch to fine tune the width of first region 1209 to achieve the target width, as will be discussed further herein. Second region 1211 may have a width W2 similar to the width of all other conductive traces in the circuit board. In embodiments, second region 1211 serves as the isolated conductive trace associated with embedded resistor 1214.

Figures 1, 2, 12D:
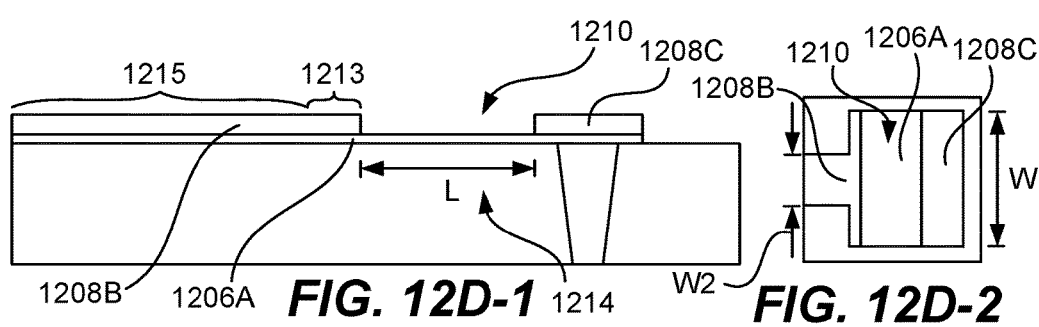

In embodiments, a second patterning and etching process may be used to selectively remove a portion of conductive layer 1208A as shown in FIGS. 12D-1 (cross-sectional view) and 12D-2 (top-down view) to form a gap 1210 that exposes a top surface of resistive layer 1206A. Accordingly, conductive layer 1208A may be split into two portions: a first conductive portion 1208B and a second conductive portion 1208C. First conductive portion 1208B may include a first region 1213 and a second region 1215. In embodiments, first region 1213 may have a different width than second region 1215 for reasons discussed above with reference to FIGS. 9 and 12C-2.

Any suitable patterning and etching process that selectively etches conductive layer 1208A over resistive layer 1206A may be used. That is, any suitable etch process that substantially removes conductive layer 1208A but does not substantially remove resistive layer 1206A may be used. For instance, an etching process utilizing an active etching solution containing permanganate may anisotropically remove conductive layer 1208 while leaving resistive layer 1206A substantially intact.

Figures 1, 2, 12E:
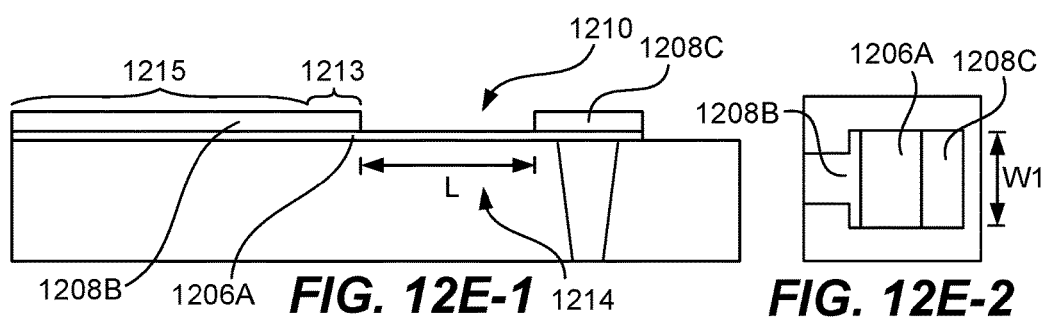

Once gap 1210 is formed, a third etch process may be used to fine tune width W into a target width W1 for achieving a target resistance to enable monitoring of signals transmitting through a memory bus as aforementioned herein, as shown in FIGS. 12E-1 (cross-sectional view) and 12E-2 (top-down view). The third etch process may be a high-precision laser process that shaves off regions of conductive portions 1208B and 1208C as well as the underlying portions of resistive layer 1206A. During laser ablation, a signal may be continuously sent between conductive portions 1208B and 1208C through exposed portions of resistive layer 1206A to monitor the resistance value achieved by the exposed portion of resistive layer 1206A. The resistance value is fed back to the laser tool performing the laser ablation to trim width W of gap 1210 to a target value. The target value may be a resistance value that is suitable to generate a quality copy of a signal transmitted through first via 1202 but also prevents disturbance of the original bus signal, as mentioned above with reference to FIG. 5 and other figures. As an example, the laser ablation process removes edges of conductive portions 1208B and 1208C and resistive layer 1206A to result in a width W1 as shown in FIG. 12E-2. The resulting structure forms an embedded resistor 1214 with the appropriate resistance value suitable for monitoring a memory bus in operation.

Figure 12F:
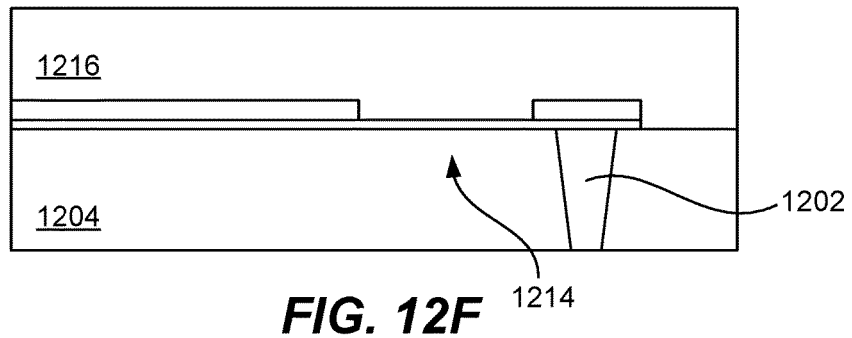

In FIG. 12F, a second insulating layer 1216 extending over embedded resistor 1214, first via 1202, and first insulating layer 1204 is formed using conventional techniques. Second insulating layer 1216 together with first insulating layer 1204 electrically isolate embedded resistor 1214 and its associated trace 1208B from other conducting elements such as other traces and vias. In embodiments, second insulating layer 1216 may be formed of any suitable dielectric material, such as $FR_4$. A subsequent CMP process may be used to planarize a top surface of the deposited dielectric material.

Figures 1, 2, 12G:
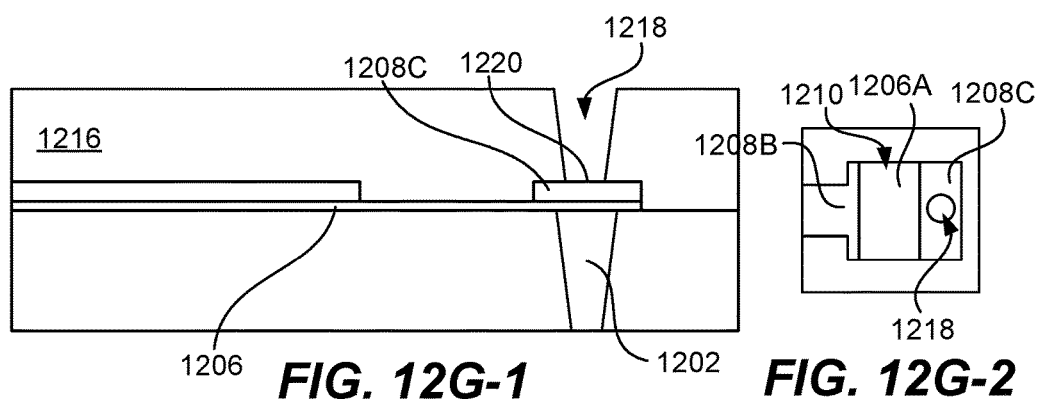

Once second insulating layer 1216 is formed, an opening 1218 may be formed in second insulating layer 1216, as shown in FIG. 12G-1 (cross-sectional view) and FIG. 12G-2 (top-down view). Opening 1218 may be formed in a similar manner to that in FIG. 12A. In embodiments, opening 1218 may expose a portion of a top surface 1220 of portion 1208C of conductive layer 1208A.

Figure 12H:
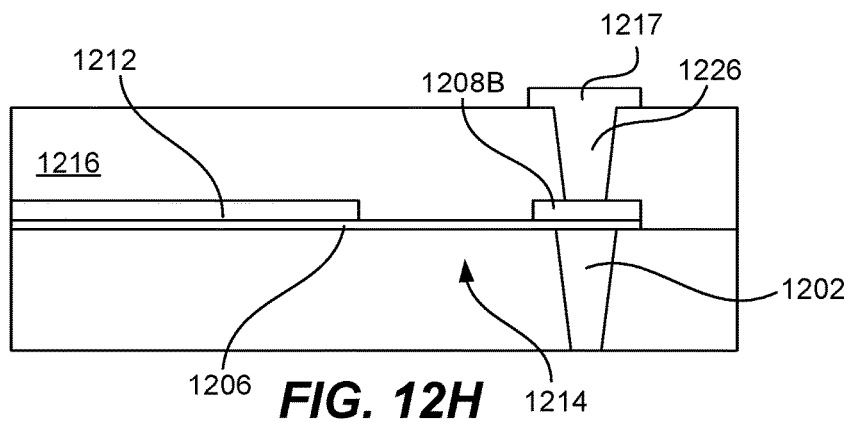

As shown in FIG. 12H, a second via 1226 may be formed in opening 1218. Second via 1226 may be formed in a similar manner to via 1202 discussed above with reference to FIG. 12A. Additional interconnect layers that may or may not include embedded resistors, may be formed in a similar manner to that described above. Other elements of the circuit board, including contact pads (such as pad 1217) along the top and/or bottom surfaces of the circuit board, as well as other process steps for completing the circuit board may be carried out using conventional techniques.

Figure 13A:
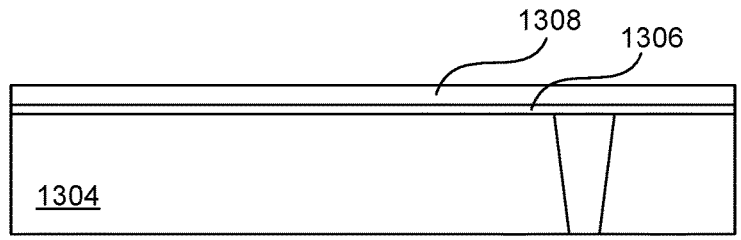
FIGS. 13A-13D illustrate another method of forming a circuit board including embedded resistors coupled to vias, according to embodiments of the present invention.

FIGS. 13A-13D illustrate a method of forming a circuit board, such as a PCB, having multiple interconnect layers and embedded resistors coupled to vias that may not extend through the entire apparatus, according to embodiments of the present invention. In FIG. 13A, the process used to form embedded resistor 1314 on first insulating layer 1304 may be similar to the process depicted in FIGS. 12B-12E-2 for forming resistor 1214, and thus the technical details of the specific processes and materials will not be described again.

Figures 1, 2, 13B:
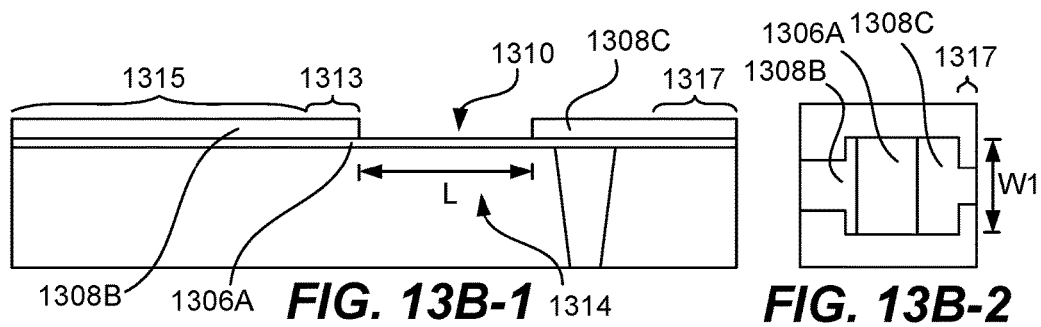

In FIG. 13A, a conductive layer 1308 and a resistive layer 1306 are formed on an first insulating layer 1304. Thereafter, as shown in FIG. 13B-1 (cross-sectional view) and FIG. 13B-2 (top-down view) an embedded resistor 1314 is formed by utilizing three etch processes similar to the three etch process discussed herein with respect to FIGS. 12C-12E that were utilized to form embedded resistor 1214. However, a notable difference between the processes used to form embedded resistor 1214 for vias that extend through the entire apparatus and the processes used to form embedded resistor 1314 for vias that do not extend through the entire apparatus is that the first etch process leaves an additional portion of the conductive layer to form a conductive trace for at least a portion of a memory bus, for reasons discussed herein with respect to FIG. 8B. Accordingly, a portion 1308C of conductive layer 1308 may have a region 1317 that extends to form a conductive trace for the memory bus.

Figures 1, 2, 13C:
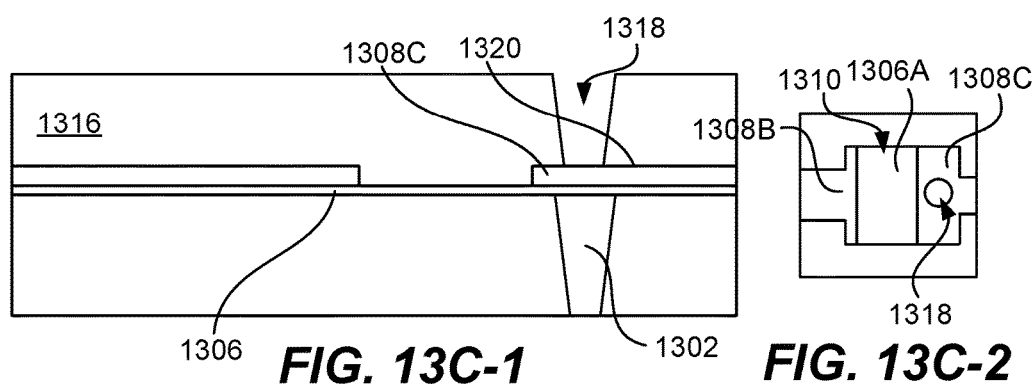
Figure 13D:
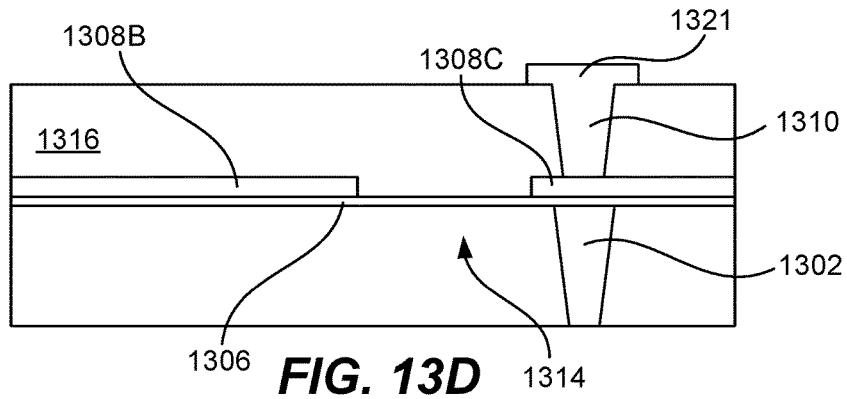

In FIG. 13C-1 (cross-sectional view) and FIG. 13C-2 (top-down view) a second insulating layer 1312 with an opening 1309 is formed on embedded resistor 1314 and first insulating layer 1304 using similar process steps to those depicted in FIGS. 12F and 12G. Similar to opening 1218 in FIG. 12G, opening 1309 exposes a region of conductive portion 1308C beside region 1317 that forms the conductive trace for the memory bus. This allows a conductive via 1310 formed in opening 1309 be electrically coupled to embedded resistor 1306, while also coupled to the memory bus through conductive trace 1317. Via 1310 may be formed by any suitable method, such as any method discussed herein with reference to FIG. 12A for forming via 1202. Process steps for forming other elements of the circuit board including contact pads (such as pad 1321 in FIG. 13D) along the top and/or bottom surfaces of the circuit board, as well as other process steps for completing the circuit board may be carried out using conventional techniques.

In embodiments, conductive trace 1317 and vias 1310 and 1320 form part of a bus, e.g., a memory bus, through which two electronic components (e.g., ICs) coupled to the PCB communicate with one another. Embedded resistor 1314 is connected to both conductive trace 1317 and via 1310. During operation, resistor 1314 serves to provide a quality copy of the bus signal propagating through via 1326 and conductive trace 1317 on isolated trace 1308B.

While FIGS. 13A-13D show process steps for forming two PCB interconnect layers, the same or variations of these process steps may be repeated the requisite number of times to form the desired number of interconnect layers. In some embodiments, the PCB interconnect layer that includes isolated conductive trace 1314A may also include other conductive traces (e.g., that form part of the bus) that also include an underlying resistive layer 1311. This simplifies the manufacturing process. It is noted that resistors 1306 may all be formed at the same or different interconnect layers.

As discussed with reference to the exemplary embodiments described herein, the embedded resistors and the associated conductive traces enable monitoring of an entire memory bus by providing the monitoring device with real time quality copies of the bus signals. The particular structure and resistance value of the embedded resistors preserve the integrity of the original bus signals. The ability to monitor the entire memory bus in operation, as provided by the various embodiments disclosed herein, provides a number of opportunities that were not possible without the monitoring techniques disclosed herein. some of these opportunities are described next.

For example, being able to monitor the entire memory bus in operation enables an electronic device, such as a smart phone or a laptop, to dynamically optimize its performance. Copied signals generated according to embodiments described herein may be fed back to a processor to gauge the performance of the memory device. The processor may then use this information to alter, e.g., improve, the operation of the memory device. As an example, the processor may alter the operation of the memory device depending on its surrounding environmental condition. Signal behavior in an arctic climate may be different than signal behavior in a tropical environment. Similarly, signal behavior when an electronic device is just running a web browser may be different than signal behavior when the electronic device is running a graphic-intensive game. By providing feedback to the processor, the processor may recognize the behavioral differences in each environment and alter the way it interacts with the memory device to compensate for those differences, such as slowing down or speeding up clock speed, and/or increasing or decreasing the operating power supply voltage. Accordingly, the processor may optimize performance of the memory device and thus, enhance the performance of the electronic device in any given scenario.

As another example, embodiments of the present invention can be used to enhance the ability to pinpoint root causes of failures during manufacturing of memory devices. Having the ability to monitor the entire memory bus in operation allows a manufacturer to see exactly how the memory device is operating under various conditions. Any abnormalities may be easily detected by examining the signal copies.

Furthermore, in addition to optimizing performance and enhancing failure analysis, embodiments of the present invention may help restore an electronic device to its latest working condition following an operating system failure. Often, electronic devices, such as personal computing devices, may crash, causing a user to lose anything that was not saved. By constantly monitoring the operation of the memory device, a processor may recognize when the memory device is about to fail. For instance, if a response to clock speed is slowly degrading or trending to a failing limit, the processor may recognize the trend and save the current content of the memory. Once the electronic device crashes, the user may reboot the electronic device and restore the electronic device using the saved memory content.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A circuit board, comprising:
   conductive traces being sandwiched by an upper insulating layer and a lower insulating layer;
   a first array of conductive vias extending perpendicularly to the conductive traces, the vias in the first array of conductive vias being arranged such that any two adjacent vias in a row of vias extending along any given dimension in the first array of conductive vias are equally spaced from each other; and
   isolation resistors embedded within the first array of conductive vias such that each isolation resistor is disposed between at least two adjacent vias in the first array of conductive vias, wherein the conductive traces include a first group of conductive traces, each of the conductive traces in the first group of conductive traces being coupled to a different conductive via in the first array of conductive vias through one of the isolation resistors, each isolation resistor being disposed closer to the conductive via to which the isolation resistor is coupled than all other conductive vias surrounding the isolation resistor, each isolation resistor being configured to produce a copy of a signal flowing through the conductive via that is coupled to one end of the isolation resistor on the conductive trace that is coupled to an opposite end of the isolation resistor.

2. The circuit board of claim 1, wherein each conductive trace in the first group of conductive traces includes a conductive upper layer and a resistive lower layer, the conductive upper layer having an opening through which a portion of the resistive lower layer is exposed, the exposed portion of the resistive lower layer forming one of the isolation resistors.

3. The circuit board of claim 2 wherein the exposed portion of the resistive layer is spaced less than 50 μm from the conductive via to which it is coupled.

4. The circuit board of claim 1, wherein a spacing between every two adjacent conductive vias along a row of conductive vias in the first array of conductive vias is in the range of 0.35 mm to 0.8 mm.

5. The circuit board of claim 1, wherein a resistance value of each embedded isolation resistor is less than 50 ohms.

6. The circuit board of claim 1, further comprising a first array of contact pads disposed on a surface of the circuit board, each via in the first array of conductive vias terminating at and electrically connecting to a corresponding contact pad in the first array of contact pads, wherein the circuit board is configured so that a first integrated circuit can be mounted on and electrically connected to the first array of contact pads.

7. The circuit board of claim 1 further comprising:
a second array of conductive vias being insulated from one another; and
a second array of contact pads disposed on a surface of the circuit board, each via in the second array of conductive vias terminating at and electrically connecting to a corresponding contact pad in the second array of contact pads, the second array of contact pads being connected to the first group of conducive traces through the second array of conductive vias,
wherein the circuit board is configured so that a monitoring device can be connected to the second array of contact pads for monitoring signals on the second array of contact pads.

8. The circuit board of claim 7, wherein the first array of conductive vias form part of a communication bus through which the first integrated circuit can communicate with a second integrated circuit, and during operation, each conductive trace in the first group of conductive traces carries a copy of a bus signal propagating through a corresponding one of the conductive vias in the first array of conductive vias so that the entire communication bus can be simultaneously monitored on the second array of contact pads.

9. The circuit board of claim 7 further comprising:
a third array of contact pads on a surface of the circuit board,
a third array of conductive vias being insulated from one another; and
a third array of contact pads disposed on a surface of the circuit board, each via in the third array of conductive vias terminating at and electrically connecting to a corresponding contact pad in the third array of contact pads, the conductive traces including a second group of conducive traces, the third array of contact pads being connected to the second group of conducive traces through the third array of conductive vias,
wherein the circuit board is configured so that a second integrated circuit can be mounted on and electrically connected to the third array of contact pads.

10. The circuit board of claim 1, wherein the first array of conductive vias include through-vias connecting the first array of contact pads disposed on a first surface of the circuit board to corresponding contact pads in an array of contact pads disposed on a second surface of the circuit board opposite the first surface.

11. The circuit board of claim 1 further comprising a plurality of interconnect layers stacked on top of one another, each interconnect layer being insulated from an adjacent interconnect layer,
wherein the conductive traces include multiple groups of conductive traces, each group of conductive traces being disposed in a different one of the plurality of interconnect layers, and the conductive traces in each group of conductive traces extending along the same plane,
wherein the isolation resistors are disposed in a first one of the plurality of interconnect layers, and each of the conductive traces in the group of conductive traces disposed in the first one of the plurality of interconnect layers includes a conductive upper layer and a resistive lower layer.

12. The circuit board of claim 1, further comprising a plurality of interconnect layers stacked on top of one another, each interconnect layer being insulated from an adjacent interconnect layer,
wherein the conductive traces include multiple groups of conductive traces, each group of conductive traces being disposed in a different one of the plurality of interconnect layers, the conductive traces in each group of conductive traces extending along the same plane,
wherein the isolation resistors are disposed in two or more of the plurality of interconnect layers.

13. A method of forming a circuit board, comprising:
forming conductive traces insulated from one another;
forming multiple arrays of conductive vias extending perpendicularly to the conductive traces; and
forming multiple arrays of contact pads disposed on one or more surfaces of the circuit board, the multiple arrays of contact pads including a first array of contact pads, the multiple arrays of conductive vias including a first array of conductive vias, each via in the first array of conductive vias terminating at and electrically connecting to a corresponding contact pad in the first array of contact pads, the vias in the first array of conductive vias being arranged such that any two adjacent vias in a row of vias extending along any given dimension in the first array of conductive vias are equally spaced from each other,
wherein the conductive traces include a first group of conductive traces, each conductive trace in the first group of conductive traces being coupled to a different conductive via in the first array of conductive vias through an isolation resistor embedded in the first array of conductive vias adjacent the conductive via to which the isolation resistor is coupled, each isolation resistor being disposed between at least two adjacent vias in the first array of conductive vias, and each isolation resistor being disposed closer to the conductive via to which the isolation resistor is coupled than all other conductive vias surrounding the isolation resistor, each isolation resistor being configured to produce a copy of a signal flowing through the conductive via that is coupled to one end of the isolation resistor on the conductive trace that is coupled to an opposite end of the isolation resistor.

14. The method of claim 13 wherein forming each conductive trace in the first group of conductive traces comprises:
providing a conductive layer;
forming a resistive layer on the conductive layer; and
forming an opening in the conductive layer to expose a portion of the underlying resistive layer, the exposed portion of the underlying resistive layer forming one of the isolation resistors.

15. The method of claim 14, wherein the exposed portion of the resistive layer is spaced less than 50 μm from the via to which it is coupled.

16. The method of claim 13, wherein a resistance value of each embedded isolation resistor is less than 50 ohms.

17. The method of claim 13, wherein the multiple arrays of conductive vias include a second array of conductive vias, and the multiple arrays of contact pads include a second array of contact pads, each via in the second array of conductive vias terminating at and electrically connecting to a corresponding contact pad in the second array of contact pads, the second array of contact pads being connected to the first group of conducive traces through the second array of conductive vias, wherein the circuit board is configured so that a monitoring device can be connected to the second array of contact pads for monitoring signals on the second array of contact pads.

18. The method of claim 17 wherein the multiple arrays of conductive vias include a third array of conductive vias being insulated from one another, and the multiple arrays of contact pads include a third array of contact pads, each via in the third array of conductive vias terminating at and electrically connecting to a corresponding contact pad in the third array of contact pads, the third array of contact pads being connected to a second group of the conducive traces through the third array of conductive vias, wherein the circuit board is configured so that a first integrated circuit can be mounted on and electrically connected to the first array of contact pads, and a second integrated circuit can be mounted on and electrically connected to the third array of contact pads.

19. The method of claim 17, wherein the first array of conductive vias include through-vias connecting the first array of contact pads disposed on a first surface of the circuit board to corresponding contact pads in an array of contact pads disposed on a second surface of the circuit board opposite the first surface.

20. The method of claim 13 wherein the circuit board includes a plurality of interconnect layers stacked on top of one another, each interconnect layer being insulated from an adjacent interconnect layer,
  wherein the conductive traces include multiple groups of conductive traces, each group of conductive traces being disposed in a different one of the plurality of interconnect layers, the conductive traces in each group of conductive traces extending along the same plane,
  wherein the isolation resistors are disposed in a first one of the plurality of interconnect layers, and each of the conductive traces in the group of conductive traces disposed in the first one of the plurality of interconnect layers includes a conductive upper layer and a resistive lower layer.

* * * * *

UNITED STATES PATENT AND TRADEMARK OFFICE
CERTIFICATE OF CORRECTION

PATENT NO. : 9,763,329 B1
APPLICATION NO. : 15/068474
DATED : September 12, 2017
INVENTOR(S) : Anne M. Mason et al.

It is certified that error appears in the above-identified patent and that said Letters Patent is hereby corrected as shown below:

In the Specification

Column 10, Line 43 insert:
--FIG. 5 is a simplified diagram illustrating a detailed view of interposer 400, according to embodiments of the present invention. As shown, interposer 400 includes an array of vias 506 for routing electrical signals between memory device 404 and PCB 200. In embodiments, vias 506 may be through-vias constructed to allow electrical signals to transmit directly through interposer 400 between opposing pads 406 and 408. For instance, the through-vias may be constructed as a vertical structure that spans the entire thickness of interposer 400. Although embodiments herein discuss vias 506 as through-vias, any other suitable conductive structures for routing signals may be used instead.--

In the Claims

Claim 3, Column 22, Line 66 delete "the resistive layer" and insert --the resistive lower layer--.

Claim 15, Column 24, Line 60 delete "the underlying resistive layer" and insert --the resistive layer--.

Signed and Sealed this
Seventeenth Day of April, 2018

Andrei Iancu
*Director of the United States Patent and Trademark Office*